(12) United States Patent
Tsurumi et al.

(10) Patent No.: US 8,076,264 B2
(45) Date of Patent: Dec. 13, 2011

(54) CONDUCTIVE SUBSTANCE-ADSORBING RESIN FILM, METHOD FOR PRODUCING CONDUCTIVE SUBSTANCE-ADSORBING RESIN FILM, METAL LAYER-COATED RESIN FILM USING THE SAME, AND METHOD FOR PRODUCING METAL LAYER-COATED RESIN FILM

(75) Inventors: Mitsuyuki Tsurumi, Kanagawa (JP); Shiki Ueki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 97 days.

(21) Appl. No.: 12/593,922

(22) PCT Filed: Jan. 11, 2008

(86) PCT No.: PCT/JP2008/050247
§ 371 (c)(1),
(2), (4) Date: Sep. 30, 2009

(87) PCT Pub. No.: WO2008/126426
PCT Pub. Date: Oct. 23, 2008

(65) Prior Publication Data
US 2010/0113264 A1    May 6, 2010

(30) Foreign Application Priority Data

Mar. 30, 2007 (JP) .................................. 2007-095759
May 31, 2007 (JP) .................................. 2007-146249

(51) Int. Cl.
*B01J 20/26* (2006.01)
*B01J 20/00* (2006.01)
*B01J 20/22* (2006.01)

(52) U.S. Cl. ..................... 502/402; 502/400; 502/401

(58) Field of Classification Search .............. 502/400, 502/401, 402
See application file for complete search history.

(56) References Cited

U.S. PATENT DOCUMENTS

| 2003/0068581 A1 | 4/2003 | Kawamura et al. |
| 2008/0029294 A1 | 2/2008 | Kawamura et al. |
| 2009/0022885 A1* | 1/2009 | Matsumoto et al. ......... 427/98.5 |

FOREIGN PATENT DOCUMENTS

| JP | 58-196238 A | 11/1983 |
| JP | 2004-56106 A | 2/2004 |
| JP | 2006-228951 A | 8/2008 |
| WO | 2005/120142 A1 | 12/2005 |

OTHER PUBLICATIONS

Esp@cenet patent family list for JP2006-228951. Viewed Mar. 1, 2011.*

(Continued)

*Primary Examiner* — Stuart Hendrickson
*Assistant Examiner* — Daniel Berns
(74) *Attorney, Agent, or Firm* — Solaris Intellectual Property Group, PLLC

(57) ABSTRACT

The invention provides a conductive substance-adsorbing resin film on which a conductive layer being excellent in adhesion to the resin film and having less unevenness at the interface with the resin film can easily be formed, a method for producing the same, a metal layer-coated resin film on which a high definition wiring excellent in adhesion to the insulating resin film can easily be formed, which is obtained by using the conductive substance-adsorbing resin film of the invention, and a method for producing a metal layer-coated resin film that is a material capable of easily producing a printed-wiring board having a high definition wiring. The invention also provides a conductive substance-adsorbing resin film including at least two resin layers, wherein at least one of the resin layers is an adsorbing resin layer having a property of adsorbing a conductive substance or a metal. This conductive substance-adsorbing resin film is allowed to adsorb a metal and subjected to plating, whereby a metal layer-coated resin film can be obtained.

11 Claims, 1 Drawing Sheet

OTHER PUBLICATIONS

Luis M. Liz-Marzan et al, "Stable Hydrosols of Metallic and Bimetallic Nanoparticles Immobilized on Imogolite Fibers", J. Phys. Chem. 1995, vol. 99, pp. 15120-15128.

M. A. Carignano et al, "Adsorption of model charged proteins on charged surfaces wih grafted polymers", Molecular Phys., 2002, vol. 100, No. 18. pp. 2993-3003.

* cited by examiner

US 8,076,264 B2

CONDUCTIVE SUBSTANCE-ADSORBING RESIN FILM, METHOD FOR PRODUCING CONDUCTIVE SUBSTANCE-ADSORBING RESIN FILM, METAL LAYER-COATED RESIN FILM USING THE SAME, AND METHOD FOR PRODUCING METAL LAYER-COATED RESIN FILM

TECHNICAL FIELD

The present invention relates to a conductive substance-adsorbing resin film, a method for producing the same, a metal layer-coated resin film obtained by using the conductive substance-adsorbing resin film and a method for producing the same, and in particular, to a conductive substance-adsorbing resin film useful in preparing a metal layer-coated resin film used in preparing a flexible printed-wiring board having a high-density wiring used in the field of electronic materials, a method for producing the same, a metal layer-coated resin film obtained by using the same, and a method for producing the same.

BACKGROUND ART

In recent years, the high-density integration of electronic parts and high-density mounting etc. have been advancing along with demand for highly advanced functions of electronic devices, and printed wiring board for high-density mounting used therein is also becoming down-sized and highly densified.

Among them, a metal layer-coated resin film substrate is widely used as a substrate for mounting of driving semiconductors for displaying an image on a liquid crystal display or as a substrate used in an operating part requiring flexibility. In recent years, COF (chip-on-film) attracts attention as a means for mounting driver IC chips for liquid crystal display. It is said that COF as compared with the conventional major mounting technique TCP (tape-carrier-package) enables fine pitch mounting and enables down-sizing of driver IC and cost reduction. In COF, there is a strong demand in recent years for high-definition and fine pitch electronic circuits along with high definition of recent liquid crystal displays and down-sizing of liquid crystal driving ICs.

In formation of these fine pitch wirings, the "subtractive method" and "semi-additive method" are known as metal pattern forming methods useful in conventional electroconductive patterns, particularly in printed-wiring boards. The subtractive method is a method wherein a photosensitive layer sensitive to irradiation with active ray is arranged on a metal layer formed on an insulating resin film, and this photosensitive layer is subjected to imagewise exposure and developed to form a resist image, and then the metal is etched to form a metal pattern, and finally the resist is removed. The metal-coated resin substrate used in the subtractive method is formed by arranging a resin varnish layer on a metal foil and solidifying the resin varnish or by arranging a thermoplastic layer on an insulating resin film and laminating a metal foil thereon, or by arranging a feed layer on the surface of an insulating resin film by some methods and passing a current through the feed layer thereby conducting electroplating. The method used in forming the feed layer may be plating, sputtering, vapor deposition and lamination of a thin metal foil.

On the other hand, the semi-additive method is a method wherein a feed layer is arranged on the surface of an insulating resin film by some methods, a photosensitive layer sensitive to irradiation with active ray is arranged on the feed layer, this photosensitive layer is subjected to imagewise exposure and developed to form a resist image, the feed layer is electrified to effect electroplating to form a metal wiring on the non-resist portion and then the feed layer in the non-metal wiring part is etched to form a metal pattern. The method used in forming the feed layer may be plating, sputtering, vapor deposition and lamination of a thin metal foil. However, a metal-coated resin substrate having a resin varnish layer formed on a metal foil, or a laminate having a thermoplastic layer formed between a metal foil and an insulating resin film, has a problem that when fine wirings are to be formed, fine wirings cannot be formed due to uneven surface attributable to the metal foil. On the other hand, when the unevenness of the copper foil is reduced, there is a problem that sufficient adhesion between the metal layer and the insulating resin film cannot be attained.

In the method of arranging a feed layer by metal sputtering or vapor deposition, a metal layer is arranged on a smooth surface and thus fine wirings can be easily formed, but the adhesion between a metal and an insulating resin film is not sufficient, and production thereof requires large vacuum facilities, the operation is complicated, the forming speed is low, so the yield is low and the costs are high. Since a hole for the connection between circuits of both sides is made after formation of a metal layer on the whole surface, a connection in the hole by plating is separately necessary, and a metal layer by plating should be formed on the previously formed metal layer, thereby making the metal layer thicker than necessary and thus necessitating long etching time in forming the circuit.

As described above, when a wiring pattern is formed on a substrate or an insulating resin film, the adhesion between the insulating resin film and the wiring pattern becomes problematic. For example, when a polyimide varnish layer that is an insulating resin is formed on a copper foil, from which a metal layer-coated resin film is obtained by heat reaction, its adhesion is attributable to the adhesion between the copper foil layer and the polyimide varnish layer. However, when the surface of the copper foil is made uneven for increasing adhesion by an anchor effect, it is necessary that as the distance between wirings decreases, the unevenness is decreased to such an extent that the shape of wirings is not influenced, so there is a problem that sufficient adhesion cannot be achieved. On the other hand, the method of forming copper on polyimide by sputtering does not attain sufficient adhesion and the film making speed is low, and thus there is a problem that the cost is increased.

To solve this problem, there is a proposed method wherein the surface of a substrate is modified by grafting with a radically polymerizable compound, thereby minimizing the unevenness of the substrate and facilitating the step of processing the substrate (for example, see Japanese Patent Application Laid-Open (JP-A) No. 58-196238), but this method requires expensive apparatuses ($\gamma$-ray generator, electron beam generator). The substrate used is a usual commercial plastic substrate, and thus the graft polymer is not sufficiently generated to such an extent that a conductive material is strongly adhered thereto, so there is a problem that the adhesion between a substrate and a conductive layer does not reach practical strength. As one means of forming an electroconductive layer, a method wherein a surface graft polymer whose polymer terminal is fixed on the surface of a substrate is used to accumulate gold nanoparticles at one step has been reported (see, for example, Liz-Marzan, L. M. et al., J. Phys. Chem. Vol. 99, p. 15120 (1995) and Carignano, M. A. et al., Mol. Phys. Vol. 100, p. 2993, (2002)). Under the conditions described therein, however, practically satisfactory interaction is not formed in the phenomenon of particle aggregation by the electrostatic force between the charged polymer and charged particles, so there is further demand for improvement in practical adhesion to conducive materials.

In formation of such surface graft polymers, a step of applying energy to monomer components as the starting material of graft polymers while the monomer components are contacted with the surface of a substrate is necessary, but there is a problem that it is difficult to maintain uniformity in the step, such as uniform contact and uniform energy application.

DISCLOSURE OF INVENTION

An object of the present invention made in view of the technical problems in the conventional art is to provide a conductive substance-adsorbing resin film which can form, on the surface thereof, a conductive layer being excellent in adhesion to the resin film and having less unevenness at the interface with the resin film, and a method for producing the same.

Another object of the invention is to provide a metal layer-coated resin film which can easily form a high-definition wiring excellent in adhesion to the insulating resin film, which is obtained by using the conductive substance-adsorbing resin film of the invention, as well as a method for producing a metal layer-coated resin film that is a material capable of easily producing a printed-wiring board having a high definition wiring.

The inventors made extensive study and found that the problem can be addressed by the following constitution, and the invention was thereby completed.

That is, the constitution of the invention is as follows:

<1> A conductive substance-adsorbing resin film comprising at least two resin layers, wherein at least one of the resin layers is an adsorbing resin layer having a property of adsorbing a conductive substance or a metal.

<2> The conductive substance-adsorbing resin film of <1>, wherein the adsorbing resin layer having a property of adsorbing a conductive substance or a metal is formed by applying energy to an adsorbing resin precursor layer containing an oligomer with a molecular weight of 1,000 to 300,000 having a functional group having a property of adsorbing a conductive substance or a metal, and thereby generating chemical, electrical or physical bonding between the adsorbing resin precursor layer and another adjacent resin layer and adhering the layers to each other.

<3> The conductive substance-adsorbing resin film of <1> or <2>, wherein the adsorbing resin layer having a property of adsorbing a conductive substance or a metal is arranged on one side or both sides of a resin layer constituting a support, and the adsorbing resin layer and the resin layer constituting a support are adhered directly to each other by generating chemical, electrical or physical bonding.

<4> The conductive substance-adsorbing resin film of <1> or <2>, wherein the adsorbing resin layer having a property of adsorbing a conductive substance or a metal is arranged on one side or both sides of a resin layer constituting a support, and the resin film is provided with at least one adhesion assist layer which is present between the adsorbing resin layer and the resin layer constituting a support and which generates chemical, electrical or physical bonding to the adsorbing resin layer and the resin layer constituting a support and thereby adheres to the layers.

<5> The conductive substance-adsorbing resin film of any one of <1> to <4>, wherein the adsorbing resin layer having a property of adsorbing a conductive substance or a metal includes a compound having a functional group having a property of adsorbing a conductive substance or a metal, selected from a functional group having a positive charge or dissociable to have a positive charge, a functional group having a negative charge or dissociable to have a negative charge, a nonionic polar group capable of interaction with a metal, a functional group capable of having a chelation or multidentate coordination structure with a conductive substance or a metal, a functional group capable of inclusion, or a functional group interacting with a solvent as water of crystallization in which a metal is held, and the adsorbing resin layer has a property of adsorbing at least one selected from metal ions, metal fine particles or conductive fine particles by salt formation, multidentate coordination, metal salt dispersion, inclusion, ion implantation, or ion exchange with a metal ion or a metal fine particle.

<6> The conductive substance-adsorbing resin film of any one of <1> to <5>, wherein a compound having a functional group having a property of adsorbing a conductive substance or a metal, which is included in the adsorbing resin layer having a property of adsorbing a conductive substance or a metal, is a compound derived from a copolymer containing units represented by the following formulae (1) and (2):

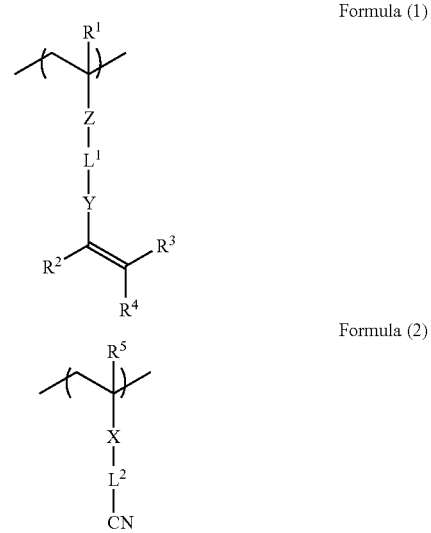

Formula (1)

Formula (2)

wherein $R^1$ to $R^5$ each independently represent a hydrogen atom or a substituted or unsubstituted alkyl group; X, Y and Z each independently represent a single bond, a substituted or unsubstituted divalent organic group, an ester group, an amido group or an ether group; and $L^1$ and $L^2$ each independently represent a substituted or unsubstituted divalent organic group.

<7> The conductive substance-adsorbing resin film of any one of <1> to <6>, wherein the conductive substance-adsorbing resin film is ultimately provided with a hole penetrating from one side to the other side.

<8> A method for producing a conductive substance-adsorbing resin film, comprising a first step of arranging, on a resin film support, a precursor layer of an adsorbing resin layer containing a compound having a functional group having a property of adsorbing a conductive substance or a metal, a second step of applying energy to the precursor layer of an adsorbing resin layer to form an adsorbing resin layer having a property of adsorbing a conductive substance or a metal, which is adhered to the resin film support by chemical, electrical or physical bonding, a third step of removing an unreacted compound having a functional group having a property of adsorbing a conductive substance or a metal, which has not generated chemical, electrical or physical bonding to the adjacent resin film support, and a step of making a hole in a laminate of the resin film support and the adsorbing resin layer or a laminate of the resin film support and the precursor layer of an adsorbing resin layer, which is carried out before or after the first to third steps.

<9> The method for producing a conductive substance-adsorbing resin film of <8>, comprising a step of allowing at least one selected from metal fine particles, conductive fine particles and metal ions to be adsorbed to and held by the precursor layer of the adsorbing resin layer having a property of adsorbing a conductive substance or a metal or the adsorbing resin layer having a property of adsorbing a conductive substance or a metal by a means selected from salt formation, multidentate coordination, metal salt dispersion, inclusion, ion implantation or ion exchange.

<10> A metal layer-coated resin film produced by allowing metal ions to be adsorbed to and held by the conductive substance-adsorbing resin film of any one of <1> to <7> and then reducing the metal ions thereby precipitating a metal and forming a metal layer in the adsorbing resin layer.

<11> A method for producing a metal layer-coated resin film, comprising a step of allowing metal ions to be adsorbed to and held by the conductive substance-adsorbing resin film of any one of <1> to <7> and a step of reducing the metal ions thereby precipitating a metal and forming a metal layer in the adsorbing resin layer.

<12> A method for producing a metal layer-coated resin film, comprising a step of adsorbing metal fine particles to the conductive substance-adsorbing resin film of any one of <1> to <7>, or allowing metal ions to be adsorbed to and held by the conductive substance-adsorbing resin film and then reducing the metal ions to form metal fine particles in the adsorbing resin layer, and a step of performing electroless plating of a second metal using the adsorbed metal fine particles as a catalyst.

<13> The method for producing a metal layer-coated resin film of <12>, further comprising a step of performing electroplating after the step of performing electroless plating.

<14> The method for producing a metal layer-coated resin film of <12> or <13>, comprising a step of making a hole in the conductive substance-adsorbing resin film before the step of performing electroless plating.

The conductive substance-adsorbing resin film of the invention has on a resin film a conductive substance-adsorbing layer capable of adsorbing and holding conductive fine particles, metal fine particles, metal ions etc. in such a state that the conductive substance-adsorbing layer is adhered via chemical, electrical or physical bonding to the resin film, so that conductive substances such as metal are adsorbed to the conductive substance-adsorbing layer, thereby preparing a metal layer-coated resin film excellent in adhesion with less unevenness at the interface between the resin film and the metal layer.

Moreover, a metal layer-coated resin film produced by using the conductive substance-adsorbing resin film of the invention has a metal layer in a state of being adhered well to the resin film functioning as a substrate or a substrate for an insulating resin layer and can thus be used to prepare a printed-wiring board. The printed-wiring board thus prepared can be applied to a printed-wiring board having, on a substrate, highly fine wirings excellent in adhesion to an insulating film and widely to various electronic devices and electric devices equipped with such printed-wiring boards as circuits.

According to the invention, there can be provided a conductive substance-adsorbing resin film capable of easily forming, on the surface thereof, a conductive layer which is excellent in adhesion to the resin film and has less unevenness at the interface with the resin film, as well as a method for producing the same.

According to the invention, there can also be provided a metal layer-coated resin film which easily forms highly fine wirings excellent in adhesion to an insulting resin film by using the conductive substance-adsorbing resin film of the invention, as well as a method for producing a metal layer-coated resin film that is a material capable of forming a printed-wiring board having highly fine wirings by an easy method.

The method for producing a metal layer-coated resin film may be a method which includes adsorbing conductive fine particles, metal fine particles, metal ions etc. on the whole surface of the conductive substance-adsorbing resin film and then forming a conductive layer on the whole surface of the resin film by plating, and the metal layer-coated resin film thus obtained is used as a material for forming a wiring pattern by the subtractive process or semi-additive process.

By forming a hole from one side to the other side of the conductive substance-adsorbing resin film, the hole portion can be provided with a conductive layer when the whole surface of the resin film is provided with a conductive layer by plating or the like.

BEST MODE FOR CARRYING OUT THE INVENTION

Hereinafter, exemplary embodiments of the present invention will be described in detail.

The conductive substance-adsorbing resin film of the invention has a layered structure having at least two resin layers. Specifically, the conductive substance-adsorbing resin film of the invention includes at least two resin layers, at least one of the resin layers being an adsorbing resin layer having a property of adsorbing a conductive substance or a metal (hereinafter referred to sometimes as conductive substance-adsorbing resin layer).

The "at least two resin layers" means that the resin layers includes a support consisting of a resin film as a first resin layer, and on the surface thereof one adsorbing resin layer having a property of adsorbing a conductive substance or a metal, and if necessary other layer(s). Further, it may include, if desired, two or more conductive substance-adsorbing resin layers.

Such a conductive substance-adsorbing resin layer is formed preferably by forming, on the surface of a support consisting of a resin film (resin film layer), a conductive substance-adsorbing resin precursor layer containing a compound having a function of enabling interaction with the adjacent resin film layer upon energy application and having a functional group capable of adsorbing a conductive substance or a metal, and then applying energy to the precursor layer.

Figure 1:
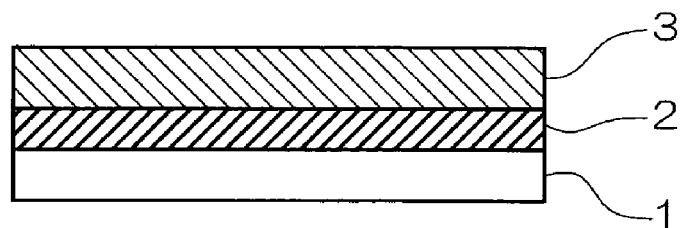
FIG. 1 is a schematic cross-sectional view showing one embodiment of the conductive substance-adsorbing resin film of the present invention.

The structure of the conductive substance-adsorbing resin film of the invention will be described with reference to FIG. 1. FIG. 1 is a schematic cross-sectional view showing one embodiment of the conductive substance-adsorbing resin film of the invention. Herein, a resin film layer (support) 1 has a conductive substance-adsorbing resin layer formed on one side thereof. FIG. 1 shows a structure wherein an adhesion assist layer 2 interacting with both the resin film layer 1 and the conductive substance-adsorbing resin precursor layer 3, and the conductive substance-adsorbing resin precursor layer 3 interacting with the adhesion assist layer 2 and having an ability to adsorbing a metal, are arranged on the surface of the resin film layer 1. The adhesion assist layer 2 is not always necessary if the resin film layer 1 has an adhesion support function of enabling direct interaction with the conductive substance-adsorbing resin precursor layer 3.

Figure 2:
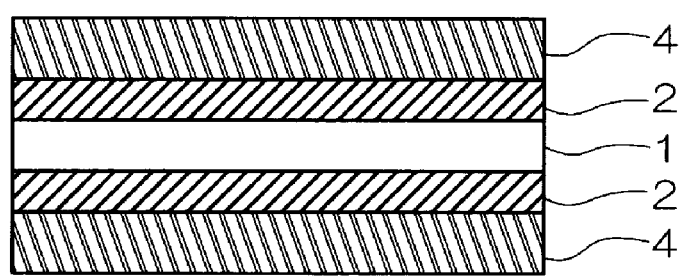
FIG. 2 is a schematic cross-sectional view showing an embodiment of the conductive substance-adsorbing resin film of the invention having conductive substance-adsorbing resin layers on both sides.

The conductive substance-adsorbing resin film in the invention may have conductive substance-adsorbing resin film layers on both sides of the resin film layer (support) 1. In this case, the conductive substance-adsorbing resin precursor layer 3 and the optional adhesion assist layer 2 are arranged on both sides of the resin film layer 1, and by applying energy to both the sides, the conductive substance-adsorbing resin film provided on both the sides with conductive substance-adsorbing resin layers 4 as shown in FIG. 2 can be obtained.

The resin film layer 1 functioning as a support in the invention may be previously provided with a hole penetrating from one side to the other side; alternatively, after the adhesion assist layer 2 or the conductive substance-adsorbing resin precursor layer 3, or the conductive substance-adsorbing resin layer 4 obtained therefrom, are formed or after conductive substances such as conductive fine particles, metal fine particles or metal ions are adhered to the conductive-adsorbing resin layer 4 to form a metal layer 5, a hole penetrating through the layered structure may be formed.

The method for producing the metal layer-coated resin film in the invention may be a method wherein a metal is adsorbed by some methods to the conductive substance-adsorbing layer in the conductive substance-adsorbing resin film and then a metal layer is grown by electroless plating, displacement plating, or electroplating.

Figure 3:
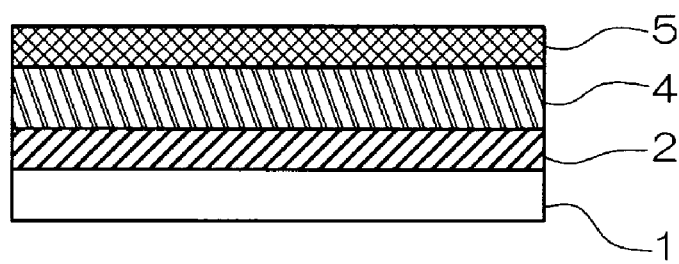
FIG. 3 is a schematic cross-sectional view showing one embodiment of a metal layer-coated resin film obtained by using the conductive substance-adsorbing resin film of the invention.

FIG. 3 is a schematic cross-sectional view showing one embodiment of the metal layer-coated resin film in the invention. On the surface of the resin film 1, an adhesion assist layer 2 and a conductive substance-adsorbing resin precursor layer (such as the conductive substance-adsorbing resin precursor layer 3 illustrated in FIG. 1) are layered, and by applying energy, a conductive substance-adsorbing resin layer 4 is formed, and a metal layer 5 is arranged thereon.

<Conductive Substance-Adsorbing Resin Film and Method for Producing the Same>

Hereinafter, the conductive substance-adsorbing resin film of the invention, together with the method for producing the same, will be described in detail.

Production of the conductive substance-adsorbing resin film includes a step of arranging, on one or both sides of its starting resin film layer 1 (which because of its function as a resin support in the exemplary embodiment, is also referred to hereinafter as resin support), the adhesion assist layer 2 assisting adhesion to the conductive substance-adsorbing resin layer. Herein, a step of applying an adhesion assist layer 2 coating liquid and then applying energy to cure the adhesion assist layer 2 can be carried out.

Then, a step of arranging a precursor layer 3 of the conductive substance-adsorbing resin layer on the surface of the formed adhesion assist layer 2 is carried out. By applying energy, a compound contained in the precursor layer 3 of the conductive substance-adsorbing resin layer and a compound contained in the adhesion assist layer 2 form chemical, electrical or physical interaction and thereby adhered to each other to form a conductive substance-adsorbing resin layer 4.

In this manner, the conductive substance-adsorbing layer 4 is formed on the surface of the resin support 1 to give the conductive substance-adsorbing resin film of the invention having a layered structure.

The conductive substance-adsorbing resin film is subjected to a step of making a through-hole (opening) for connection to a wiring on the back side of the resin film and a step of applying a metal on the conductive substance-adsorbing resin layer to form a metal layer thereon, thereby giving a metal layer-coated resin film. The step of making a hole may if necessary be conducted for the resin support 1, followed by forming the adhesion assist layer 2, the conductive substance-adsorbing layer 4 or its precursor layer 3, or may be conducted after the adhesion assist layer 2, the conductive substance-adsorbing layer 4 or its precursor layer 3 is formed on at least one face of the resin support 1.

These steps, that is, the steps of forming the respective layers and the step of making a hole, may be conducted successively or simultaneously or may be omitted if unnecessary. From the viewpoint of adhesion between the metal layer and the resin film, however, the step of making a hole is conducted preferably during the step of forming the resin film layer 1 or before the step of forming the adhesion assist layer 2, because the step of forming the adhesion assist layer 2 is conducted during or after the step of forming the resin film layer 1 and the step of forming the conductive substance-adsorbing resin precursor layer 3 is conducted during or after the step of forming the resin film layer 1 or the step of forming the adhesion assist layer 2.

The conductive substance-adsorbing resin film may be used for example in forming a highly adhesive metal layer on the surface thereof or may be used in adsorption, recovery etc. of metal ions in solution.

When a metal layer is further arranged on the conductive substance-adsorbing resin film of the invention to form a metal layer-coated resin film, a step of forming a metal layer may be conducted by electroless plating, displacement plating or electroplating by utilizing the metal (conductive substance) applied onto the conductive substance-adsorbing resin layer of the conductive substance-adsorbing resin film, and depending on the intended use of the metal layer, a step of connection via the hole to a wiring on the back side and a step of heat treatment after formation of the conductive layer may further be conducted.

These steps can be carried out in no particular order as necessary, may be conducted in any order or simultaneously if necessary and may be omitted if unnecessary.

The method for producing the metal layer-coated resin film of the invention is characterized by performing a step of forming a metal layer by plating after a step of forming the conductive substance-adsorbing resin layer.

Hereinafter, the components of each layer and the respective steps will be described in more detail.

(Resin Film Layer Constituting the Support)

In the invention, the starting resin film layer used as the substrate (support) of the conductive substance-adsorbing resin film can be a resin film used ordinary in an electronic substrate and formed from glass epoxy, polyester, polyimide, thermosetting polyphenylene ether, polyamide, polyaramid, paper, liquid crystalline polymer film, or the like. The resin capable of forming such resin film layers may be any resins capable of being formed into a film, such as phenol resin, epoxy resin, imide resin, BT resin, PPE resin, tetrafluoroethylene resin, liquid crystalline resin, polyester resin, PEN, aramid resin, polyamide resin, polyether sulfone, triacetyl cellulose, polyvinyl chloride, polyvinylidene chloride, polyethylene, polypropylene, polystyrene, polybutadiene, and polyacetylene.

When the conductive substance-adsorbing resin film of the invention is used in forming a flexible printed substrate for example, a resin film layer of polyimide, liquid crystalline polymer, polyethylene terephthalate or the like used in the printed substrate is used preferably as a support substrate.

The resin film layer 1 may be formed into a film so as to have a uniform and smooth surface and may, after film formation, be polished to form a finely corrugated surface for the purpose of improving adhesion to the adhesion assist layer 2 serving as an upper layer.

The step of polishing the surface of the resin film layer 1 may include mechanical polishing such as buffing, belt polishing and pumice polishing. In place of the mechanical polishing, chemical polishing, chemical mechanical polishing, electrolytic polishing or the like may be conducted. The polishing may be conducted in combination with treatment for generating active groups on the surface of the film, such as plasma treatment, corona treatment, UV treatment, ozone treatment or flame treatment, or with treatment for activating the surface by chemical decomposition. In the case of the polyimide film, treatment with a polar organic solvent or a strong alkali such as hydrazine, N-methylpyrrolidone, a solution of sodium hydroxide or a solution of potassium hydroxide may also be conducted.

From the viewpoint of improving the physical properties of the formed conductive layer, the resin film is preferably one having an average roughness (Rz) of 3 μm or less, more preferably 1 μm or less, as determined by a 10-point average height method in JIS B 0601 (1994). When the surface smoothness of the substrate is in the range of the above values, that is, when the surface is substantially free of irregularities, the resin layer can be preferably used in producing a printed-wiring board with a very fine circuit pattern (for example, a circuit pattern of 25/25 μm (line/space) or less). When the resin film is flexurally used, the thickness of the film is preferably in the range of 3 to 500 μm, more preferably 5 to 300 μm, even more preferably 7 to 200 μm.

Active species generating active sites capable of interaction may be added to the resin film layer 1 so that the film layer 1 interacts directly with the conductive substance-adsorbing resin precursor layer 3. When the resin film layer 1 and the conductive substance-adsorbing resin precursor layer 3 are to be closely contacted with each other by direct interaction, active species for generating active sites which upon energy application, interact with the conductive substance-adsorbing resin precursor layer 3 may be previously added to the resin film in forming the resin film, or the resin may contain a skeleton generating active species in the resin skeleton.

Examples of generation of active species in the resin skeleton include an example where a polyimide substrate containing a polyimide having polymerization initiation sites in its skeleton as shown below (hereinafter referred to sometimes as specific polyimide) is used.

The substrate containing the specific polyimide can be prepared by preparing a polyimide precursor compound, then forming the polyimide precursor compound into a substrate of desired shape, and heat-treating it, thereby converting the polyimide precursor into the polyimide structure (specific polyimide). Examples of the specific polyimide prepared as described above are shown below, but the invention is not limited thereto.

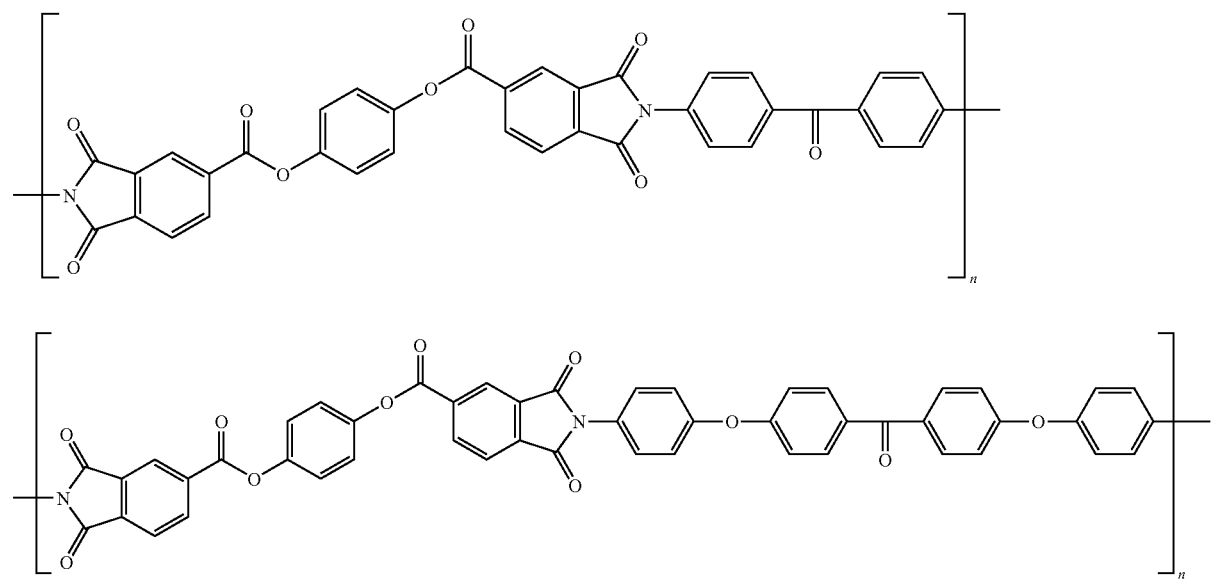

-continued
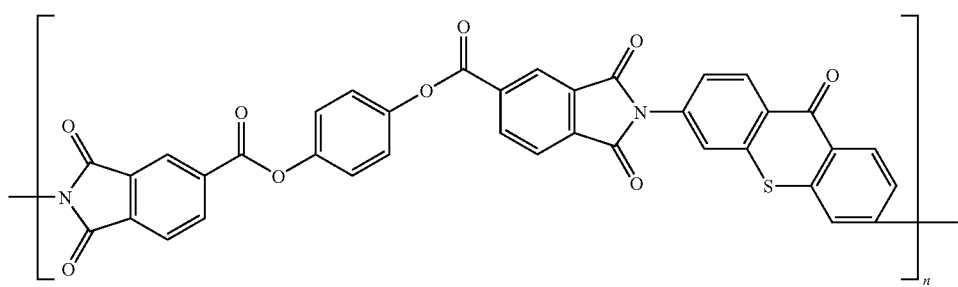
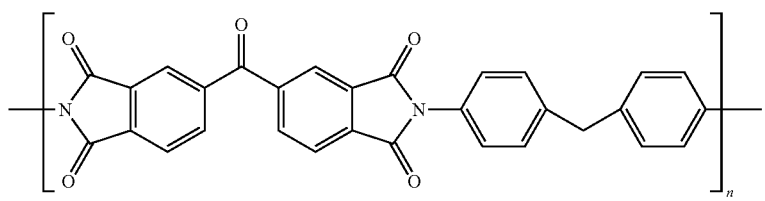
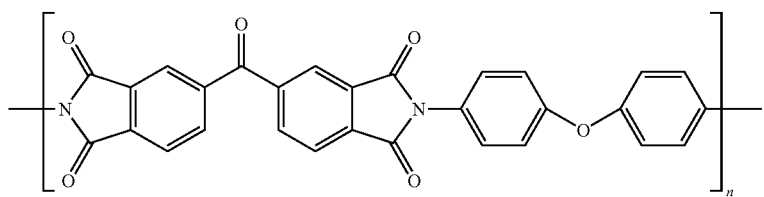
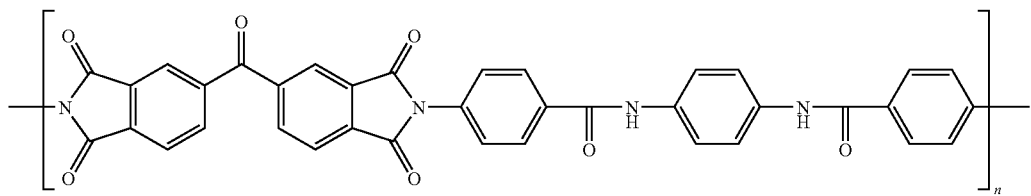
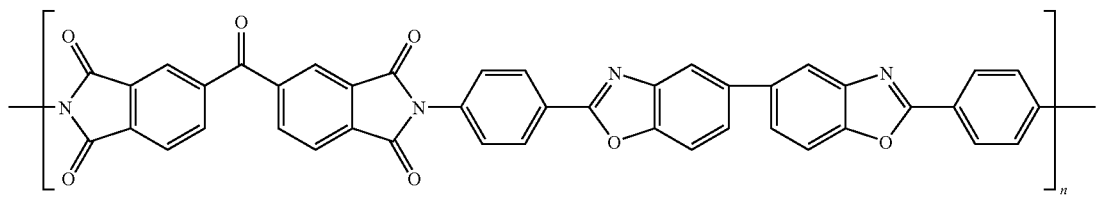
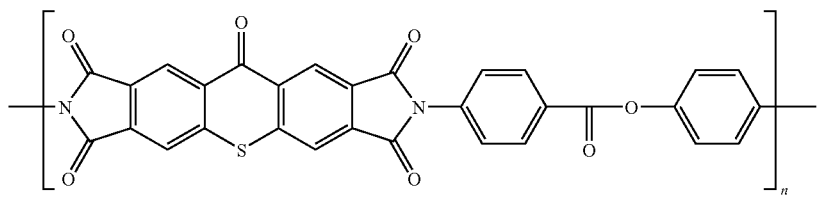
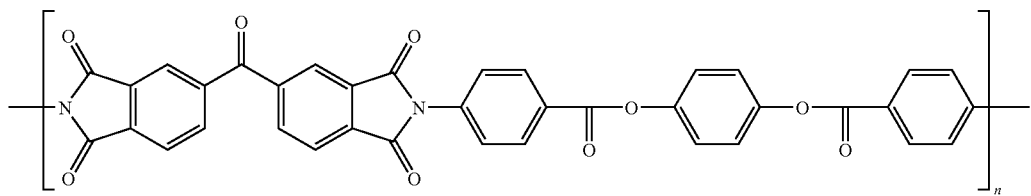

As the active species, a thermopolymerization initiator or a photopolymerization initiator can be used. As the thermopolymerization initiator, a peroxide initiator such as benzoyl peroxide or azoisobutyronitrile, or an azo initiator can be used. The photopolymerization initiator may be a low-molecular-weight compound or a high-molecular-weight compound, and a generally known photopolymerization initiator may be used. When the resin film can, by energy application, form active sites through which it interacts with the conductive substance-adsorbing resin precursor layer 3, such active species may not be particularly added.

Examples of the low-molecular-weight photopolymerization initiator that can be used herein include known radical generators, for example, acetophenones such as p-tert-butyl-trichloroacetophenone, 2,2'-diethoxyacetophenone, and 2-hydroxy-2-methyl-1-phenylpropan-1-one; benzophenones such as benzophenone and 4,4'-bisdimethylaminobenzophenone; benzyl ketals such as benzyl dimethyl ketal and hydroxycyclohexyl phenyl ketone: Michler's ketone; benzoyl benzoate; benzoins such as benzoin, benzoin methyl ether, benzoin isopropyl ether and benzoin isobutyl ether; α-acyloxime ester, tetramethyl thiuram monosulfide, trichloromethyl triazine; and thioxanthones such as -chlorothioxanthone, 2-methylthioxanthone, 2-ethylthioxanthone and 2-isopropylthioxanthone.

Sulfonium salts and iodonium salts ordinarily used as photoacid generators also act as radical generators by light irradiation and thus can also be used in the invention.

For the purpose of improving sensitivity, a sensitizer may be used in addition to the photo-radical polymerization initiator. Examples of the sensitizer include n-butylamine, triethylamine, tri-n-butylphosphine, and thioxanthone derivatives.

As the high-molecular-weight photo-radical generator, polymer compounds having an active carbonyl group in a side chain as described in JP-A Nos. 9-77891 and 10-45927, and polymers having a polymerization initiation group pendant from a side chain as described in JP-A No. 2004-161995 can also be used by mixing it in the resin film. This polymer is specifically a polymer having, on a side chain, a functional group having an ability to initiate polymerization (polymerization initiation group) and a crosslinking group (hereinafter referred to as polymerization initiation polymer), and by this polymer, a form having a polymerization initiation group bound to a polymer chain and having the polymer chain fixed by crosslinking reaction can be formed. Specific examples include those described in paragraph numbers [0011] to [0158] in JP-A No. 2004-161995. Particularly preferable examples of the polymerization initiation polymer include those having the following structural units:

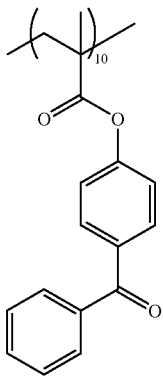
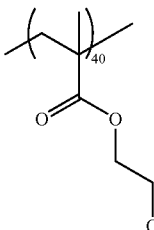
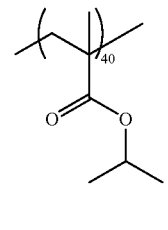

-continued

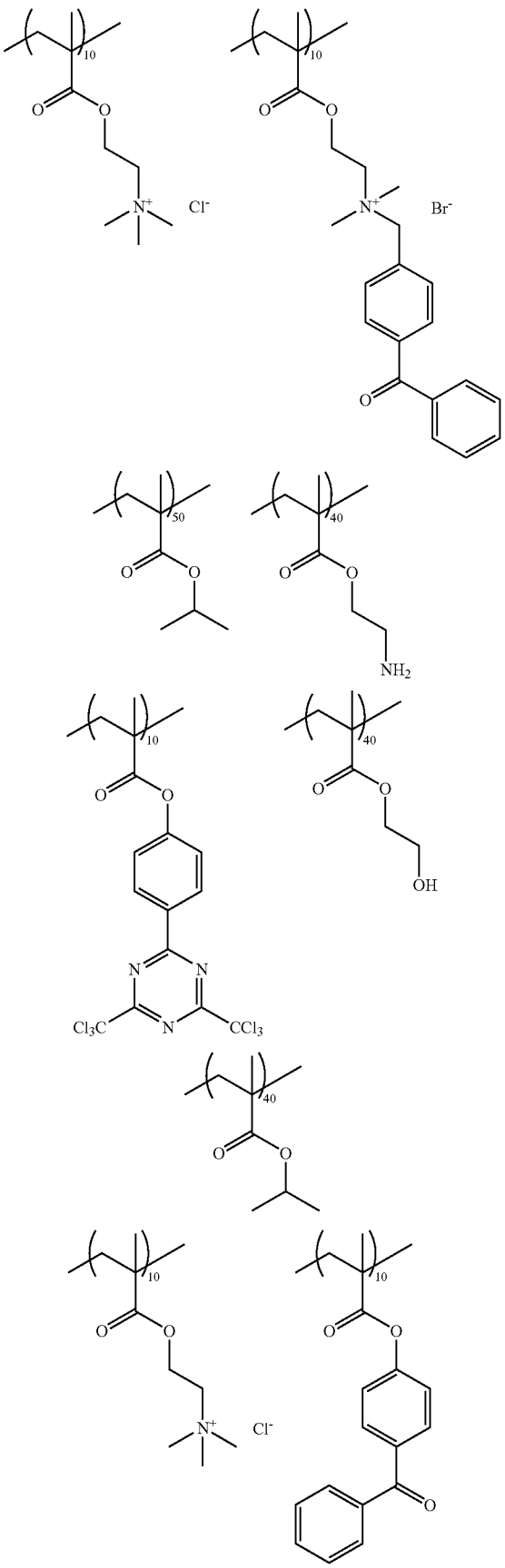

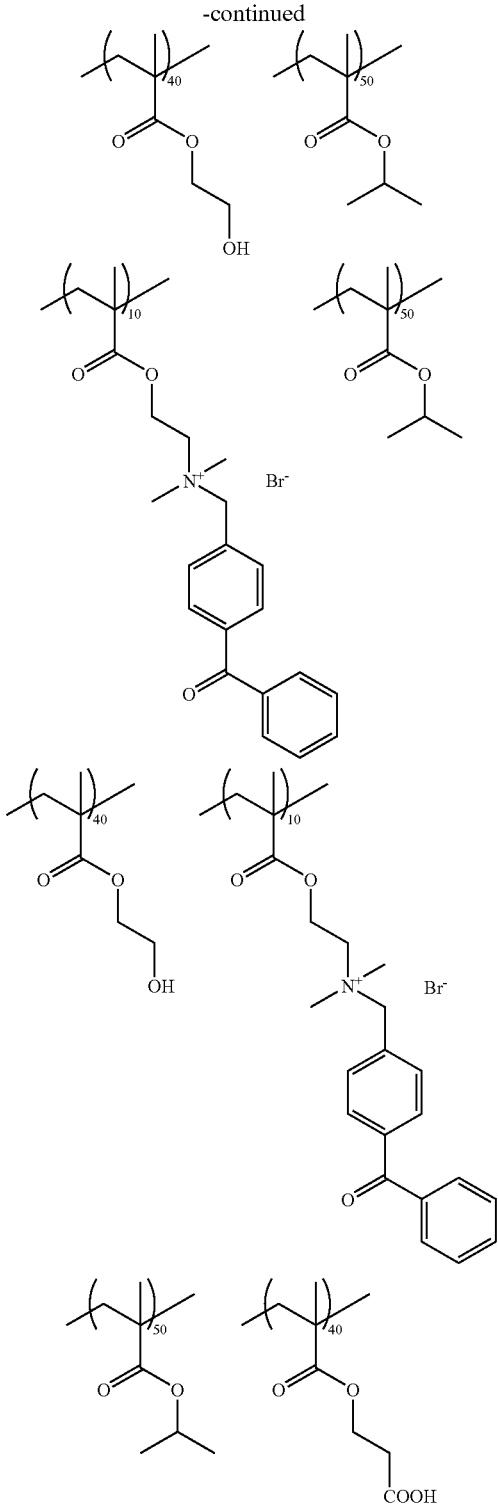

Although the molecular weight of the polymer is not particularly limited as long as the polymer can be uniformly mixed with the substrate resin film, the weight-average molecular weight is preferably 500,000 or less, more preferably 300,000 or less, even more preferably 100,000 or less. When the molecular weight is 500,000 or more, phase separation may easily occur upon mixing the polymer with the substrate resin film.

The amount of the polymerization initiator contained in the resin film is selected depending on the type of the conducive substance-adsorbing resin precursor used, but is generally preferably 0.1 to 50% by weight, more preferably 1.0 to 30.0% by weight, in terms of solid content in the insulator layer.

(Adhesion Assist Layer)

When the resin film layer 1 and the conductive substance-adsorbing resin precursor layer 3 cannot interact directly with each other, an adhesion assist layer 2 can be arranged in the invention. Examples of the adhesion assist layer 2 used in the invention include known insulating resin compositions which have been used mainly in conventional multilayer laminates, buildup substrates, or flexible substrates and can be closely attached to the resin film layer 1, or compounds which interact, in a next step of applying energy, with the conductive substance-adsorbing resin precursor layer 3 to generate active sites for forming chemical bonds, thereby enabling close attachment to the conductive substance-adsorbing resin precursor layer 3.

That is, the adhesion assist layer is constituted typically from a film-forming insulating resin composition containing a polymerization initiator capable of generating active sites.

The insulating resin composition used in forming the adhesion assist layer 2 may contain a compound that is the same as or different from the electrically insulating compound constituting the support (resin film layer 1). However, the insulating resin composition preferably contains a compound which is thermophysically similar to the electrically insulating compound in glass transition point, elastic modulus and linear expansion coefficient, in order to improve the adhesion to the resin support 1 functioning as an electrically insulating layer and to prevent the generation of thermal stress attributable to a difference in thermal properties between different resins in heat history such as annealing treatment and solder reflow treatment conducted after layer formation or after wiring formation; for example, at least one compound used in the insulating resin composition is preferably the same as the compound used in forming the resin film layer, from the viewpoint of adhesion. A coating liquid for forming the adhesion assist layer 2 may contain, in addition to the resin material forming the resin layer, compounds which can, in a next step of applying energy, form chemical bonds in which the adhesion assist layer can interact with the precursor layer 3 of the conductive substance-adsorbing resin layer and/or with the resin film layer 1, or compounds which can, upon energy application, generate active sites via which the adhesion assist layer can adhere to the resin support 1 or to a metal layer to be arranged later.

The adhesion assist layer 2 may contain, as other components, inorganic or organic particles in order to improve the strength or electrical property of the adhesion assist layer 2.

The insulating resin composition in the invention refers to a resin having insulation properties to such a degree as to be usable for a known insulating film, and may not be a complete insulator and can be applied to the invention as long as it is a resin having insulation properties adaptable to the intended object.

Specifically, the insulating resin may be for example a thermosetting resin, a thermoplastic resin or a mixture thereof. Examples of the thermosetting resin include an epoxy resin, phenol resin, polyimide resin, polyester resin, bismaleimide resin, polyolefin resin, and isocyanate resin.

Examples of the epoxy resin include, for example, cresol novolac-type epoxy resin, bisphenol A-type epoxy resin, bisphenol F-type epoxy resin, phenol novolac-type epoxy resin, alkyl phenol novolac-type epoxy resin, bisphenol F-type epoxy resin, naphthalene-type epoxy resin, dicyclopentadiene-type epoxy resin, an epoxidized condensate of a phenol and an aromatic aldehyde having a phenolic hydroxyl group, triglycidyl isocyanurate, and an alicyclic epoxy resin. These epoxy resins may be used alone or as a mixture of two or more thereof. The adhesion assist layer is thereby made excellent in heat resistance etc.

Examples of the polyolefin resin include, for example, polyethylene, polystyrene, polypropylene, polyisobutylene, polybutadiene, polyisoprene, a cycloolefin resin, and copolymers of these resins.

Examples of the thermoplastic resin include, for example, phenoxy resin, polyether sulfone, polysulfone, polyphenylene sulfone, polyphenylene sulfide, polyphenyl ether, and polyether imide. Other thermoplastic resins include (1) 1,2-bis(vinylphenylene)ethane resin or a modified resin thereof with polyphenylene ether resin (Satoru Amaha et al., Journal of Applied Polymer Science, Vol. 92, 1252-1258 (2004)), (2) liquid crystalline polymers, specifically Bexter manufactured by Kuraray Co., Ltd., and (3) fluorine resin (PTFE).

The thermoplastic resins and thermosetting resins may each be used alone or as a mixture of two or more thereof. A combination of two or more resins is used for the purpose of improving the effect by compensating for their respective drawbacks. For example, thermoplastic resins such as polyphenylene ether (PPE) are poor in resistance to heat and are thus alloyed with thermosetting resins etc. For example, PPE is alloyed with epoxy or triallyl isocyanate, or a PPE resin having a polymerizable functional group introduced into it is alloyed with another thermosetting resin. Among thermosetting resins, an isocyanate ester is a resin most excellent in dielectric characteristics, but is usually not used alone but is used as a resin modified with an epoxy resin, maleimide resin, thermoplastic resin or the like. Their details are described in "Denshi Gijyutsu (Electronics)", 2002, No. 9, p. 35. A combined resin that contains an epoxy resin and/or phenol resin as the thermosetting resin and a phenoxy resin and/or polyether sulfone (PES) as the thermoplastic resin is also used for improving dielectric characteristics.

The adhesion assist layer 2 in the invention may contain compounds which can, in a next step of applying energy, form chemical bonds in which the adhesion assist layer can interact with the precursor layer 3 of the conductive substance-adsorbing resin layer and/or with the resin film layer 1, or compounds which can, upon energy application, generate active sites via which the adhesion assist layer can adhere to the resin support 1 or to a metal layer to be arranged later.

The adhesion assist layer 2 may, besides a film-forming resin composition similar to that in the resin film layer 1, contain compounds having a polymerizable double bond for advancing crosslinking, such as acrylate or methacrylate compounds. Such compounds having an unsaturated double bond are particularly preferably multifunctional compounds, from the viewpoint of improving crosslinkage density. Other compounds having a polymerizable double bond may be resins wherein thermosetting or thermoplastic resins, for example, an epoxy resin, phenol resin, polyimide resin, polyolefin resin, fluorine resin have been partially (meth)acrylated with methacrylic acid or acrylic acid.

The adhesion assist layer 2 in the invention can also include a composite of the resin and another component (composite material) to enhance characteristics of the resin film, such as mechanical strength, heat resistance, weatherability, flame resistance, water resistance and electrical property. The materials used in forming the composite include paper, glass fibers, silica particles, phenol resin, polyimide resin, bismaleimide triazine resin, fluorine resin, polyphenylene oxide resin.

The adhesion assist layer 2 may further be compounded if necessary with one or more fillers used in general resin materials for circuit boards, for example inorganic fillers such as silica, alumina, clay, talc, aluminum hydroxide and calcium carbonate, and organic fillers such as hardened epoxy resin, crosslinked benzoguanamine resin and crosslinked acryl polymers.

The adhesion assist layer 2 may further be compounded if necessary with one or more additives such as a colorant, a flame retardant, a tackifier, a silane coupling agent, an antioxidant and an UV absorber.

When these materials are added, they are added preferably in the range of 0 to 200% by weight, more preferably in the range of 0 to 80% by weight, based on the resin as a major component. When the resin component included in the adhesion assist layer 2 shows thermal and electrical physical properties that are identical or similar to those of its adjacent resin support, addition of these additives is not always necessary. When the additives are added in an amount of higher than 200% by weight based on the resin, the resin may be deteriorated in its original characteristics such as strength.

The adhesion assist layer 2 may be compounded with an active species for generating active sites via which the adhesion assist layer can interact with the conductive substance-adsorbing resin precursor layer 3.

Examples of the active species that can be used herein include the above-mentioned thermopolymerization initiators and photopolymerization initiators that can be used in order that the resin film interacts with the conductive substance-adsorbing resin precursor layer.

The thickness of the adhesion assist layer 2 in the invention is generally preferably in the range of 0.1 to 10 μm, more preferably in the range of 0.2 to 5 μm. When the adhesion assist layer 2 is to be arranged, the adhesion assist layer having thickness in the above range attains sufficient adhesion strength to the adjacent layer and can, with thickness smaller than that of a general adhesive, achieve adhesion similar to that of an adhesive layer of predetermined thickness, thereby realizing a metal layer-coated resin film that is not only thin as a whole but also excellent in adhesion.

The adhesion assist layer 2 is formed on one side or both sides of the resin film layer 1 as a substrate by a known layer forming method such as a coating method, a transfer method or a printing method. When the transfer method is used, a transfer laminate consisting of two layers, that is, the conductive substance-adsorbing resin precursor layer and the adhesion assist layer, may be prepared and transferred at one time by lamination method onto the surface of the resin film layer 1.

Now, the process of forming the adhesion assist layer 2 by the transfer method will be described. First, the components used in forming the adhesion assist layer are dissolved in a suitable solvent or are prepared as a varnish composition, or are made compatible with each other, thereby preparing a coating liquid in the form of a solution, to improve coating property. This is applied onto a suitable temporary support and then dried to form an adhesion assist layer-forming transfer film, then the transfer film is layered on the resin film layer 1 so that the adhesion assist layer 2 only is transferred, by removing the temporary support, onto the surface of the resin film layer 1, thereby forming the adhesion assist layer 2 thereon. In this way, the adhesion assist layer is formed into a film thereby increasing the thickness accuracy of the layer and improving handleability and alignment accuracy, and therefore, this transfer method is preferably used in forming the adhesion assist layer 2.

As the solvent for preparing the coating liquid, a general organic solvent is used. The organic solvent may be either a hydrophilic or hydrophobic solvent and is preferably a solvent dissolving the thermosetting resin and thermoplastic resin that form the adhesion assist layer 2. Preferable examples of the solvent include alcohol solvents such as methanol, ethanol, 1-methoxy-2-propanol and isopropyl alcohol, ketone solvents such as acetone, methyl ethyl ketone and cyclohexanone, ether solvents such as tetrahydrofuran, ethylene glycol monomethyl ether, ethylene glycol monobutyl ether and ethylene glycol monoethyl ether, and nitrile solvents such as acetonitrile.

Other examples of the usable solvent include N-methyl-2-pyrrolidone, N,N-dimethylacetamide, N,N-dimethylformamide, ethylene glycol monomethyl ether, tetrahydrofuran, and the like. Usual solvents, for example, acetates such as ethyl acetate, butyl acetate, isopropyl acetate, cellosolve acetate, propylene glycol monomethyl ether acetate and carbitol acetate, cellosolves such as cellosolve and butyl cellosolve, carbitols such as carbitol and butyl carbitol, and aromatic hydrocarbons such as toluene, xylene, benzene, naphthalene, hexane and cyclohexane, as well as dimethylformamide, dimethylacetamide and N-methylpyrrolidone, may be used alone or as a mixture of two or more thereof.

From the viewpoint of the viscosity, workability, coating property, drying time and working efficiency of the coating liquid or the varnish, the amount of the solvent compounded in preparing the coating liquid or the varnish is preferably in the range of 5 to 3000 parts by weight, more preferably 10 to 2000 parts by weight, and even more preferably 10 to 900 parts by weight, based on 100 parts by weight of the adhesion assist layer-forming coating liquid composition.

From the viewpoint of the coating property, workability and drying time of the composition, the viscosity of the composition is preferably 5 to 5000 cps, more preferably 10 to 2000 cps, even more preferably 10 to 1000 cps.

As the method of preparing the coating liquid composition in the form of a vanish, a known method using a mixer, a beads mill, a pearl mill, a kneader or a triple roll can be used. The compounding ingredients may be added all at once or in a suitably established order. If necessary, some compounding ingredients may be previously kneaded prior to addition.

Coating onto a temporary support for preparing a transfer film is carried out by conventional methods, and examples of such methods include a blade coating method, a rod coating method, a squeeze coating method, a reverse roll coating method, a transfer roll coating method, a spin coating method, a bar coating method, an air knife method, a gravure printing method and a spray coating method.

The method of removing the solvent is not particularly limited, but the solvent is removed preferably by evaporation. Conceivable methods of evaporating the solvent include methods by heating, depressurization, and air passage. Among these methods, the method of evaporation by heating is preferable from the viewpoint of production efficiency and handleability, and the methods of evaporation under heating and air passage is more preferable.

For example, a semi-hardened and nonsticky film is formed preferably by applying the coating liquid onto one side of a temporary support described below and then drying it by heating at 80 to 200° C. for 0.5 to 10 minutes to remove the solvent.

Examples of the base film that can be used in the temporary support for the transfer film include resin sheets of polyolefins such as polyethylene, polypropylene and polyvinyl chloride, polyesters such as polyethylene terephthalate, polyamide, polyimide and polycarbonate, release papers, processed papers having a surface with regulated adhesion, and metal foils such as copper foil and aluminum foil.

The thickness of the temporary support is generally 2 to 200 μm, more preferably 5 to 50 μm, even more preferably 10 to 30 μm. If the temporary support is too thick, a problem in handleability etc. may occur when the layered film is actually used in transfer, particularly when the layered film is laminated on a predetermined substrate or wirings.

The surface of the sheet constituting the temporary support may have been subjected to matting treatment, corona treatment or release treatment. A protective layer may also be formed thereon. The resin film forming the protective layer may be made of a material that is the same as or different from the material used in the temporary support. The materials used preferably in the protective layer include the same materials as in the temporary support, for example resin sheets of polyolefins such as polyethylene, polyvinyl chloride and polypropylene, polyesters such as polyethylene terephthalate, polyamide, and polycarbonate, release papers, processed papers having a surface with regulated adhesion, and metal foils such as copper foil and aluminum foil.

The thickness of the protective layer (protective film) is generally 2 to 150 μm, more preferably 5 to 70 μm, even more preferably 10 to 50 μm. The thickness of the protective film may be different from that of the support base film.

The protective film may have been subjected to matting treatment, embossing treatment or release treatment.

When the transfer film support is made wider by about 5 mm than the insulating film or the polymer precursor layer, there is an advantage that upon lamination on another layer, the resin can be prevented from adhering to the laminate portion, and the base film constituting the temporary support can be easily removed at use.

The lamination of the adhesion assist layer is carried out under reduced pressure, and its system may be a batch system or a continuous system using a rolled layered film. When the adhesion assist layer is formed on both sides of the resin support, the adhesion assist layer may be laminated on both sides separately or simultaneously, but is preferably laminated on both sides simultaneously.

The lamination conditions described above vary depending on the viscosity of the composition hot melted, which constitutes the adhesion assist layer 2 that is solid at ordinary temperatures, the thickness of the adhesion assist layer 2, and the thickness of the resin film, but generally the lamination is carried out preferably at a pressure-bonding temperature of 70 to 200° C., at a bonding pressure of 1 to 10 kgf/cm$^2$, and at a reduced pressure of 20 mmHg or less.

As the thickness of the temporary support (transfer film support) increases, the resin composition after lamination is made more excellent in surface smoothness, but from the viewpoint of thermal conductivity, the temporary support is preferably not too thick. From this viewpoint, it is preferable that the thickness of the temporary support is equal to or more than the thickness of the adhesion assist layer and is 75 μm or less. After lamination, the temporary support is peeled off after cooling to room temperature.

In the case of transfer by lamination, the temperature is preferably 80 to 250° C., more preferably 100 to 200° C., even more preferably 110 to 180° C. The applied pressure is preferably 0.5 to 3 MPa, more preferably 0.7 to 2 MPa. The time for applying the pressure is preferably 10 seconds to 1 hour, more preferably 15 seconds to 30 minutes. For improving adhesion, lamination is preferably conducted under reduced pressure by vacuum lamination or the like. When the metal layer-coated resin film in the invention is used in forming fine wirings, the lamination of its material that is the conductive substance-adsorbing resin film of the invention is conducted preferably in a clean room.

When the adhesion assist layer 2 is arranged on the resin film by coating or printing, the coating liquid for forming the adhesion assist layer 2 may be arranged by repeatedly coating or printing the coating liquid on one side or both sides of the resin film until a predetermined thickness is reached. When the adhesion assist layer 2 is arranged by coating, the adhesion assist layer 2 and the conductive substance-adsorbing resin precursor layer may be applied simultaneously. This coating is carried out by the conventional method similar to the method of coating on the support, for example by the known coating method such as a blade coating method, a rod coating method, a squeeze coating method, a reverse roll coating method, a transfer roll coating method, a spin coating method, a bar coating method, an air knife method, a gravure printing method, a spray coating method, a dispenser method or a dipping method. When printing is used, a method such as usual gravure printing or ink jet method can be used in printing. For preventing the adhesion between the resin film and the adhesion assist layer after coating on the resin film or for preventing the adhesion between the adhesion assist layers, the layers are sometimes sufficiently dried.

After formation on the substrate, the adhesion assist layer 2 may be cured by applying some kinds of energy. The energy to be applied may be light, heat, pressure, and electron beams, among which heat or light is generally used in the exemplary embodiment. When heat is used, the adhesion assist layer 2 can be heated at 100 to 300° C. for 10 to 120 minutes. The conditions for thermal curing vary depending on the type of material of the resin film, the type of the resin composition constituting the adhesion assist layer 2, etc. The thermal curing conditions, although varying depending on the curing temperature of the forming materials, can be selected preferably in the range of 120 to 220° C. for 20 to 120 minutes.

This curing treatment step may be carried out immediately after formation of the adhesion assist layer or may be carried out after another step, for example after formation of the conductive substance-adsorbing resin layer 4, after formation of the adhesion assist layer.

(Formation of the Conductive Substance-Adsorbing Resin Layer)

After the adhesion assist layer is formed, the conductive substance-adsorbing resin precursor layer 3 is arranged thereon followed by applying energy thereto, whereby active sites capable of forming bonding, through interaction, to the conductive substance-adsorbing resin precursor layer 3 are generated on the adhesion assist layer 2, to form the conductive substance-adsorbing resin layer 4 bound to the adhesion assist layer 2.

The compound capable of generating active species, which is contained in the adhesion assist layer 2, may be either a thermopolymerization or photopolymerization initiator. For example, the initiators described above in connection with the resin film can be used. When the adhesion assist layer 2 includes a material that can, by energy application, form active sites via which the adhesion assist layer can interact with the conductive substance-adsorbing resin precursor layer, it is not necessary to separately add these active species.

Depending on the intended object, the adhesion assist layer 2 may be compounded with various compounds in addition to the compounds described above as long as the effect of the invention is not impaired. Such additives include, for example, substances such as rubber and SBR latex capable of relaxing stress during heating, as well as compounds for improving film properties, such as a binder, a plasticizer, a surfactant and a viscosity regulator.

After formation of the adhesion assist layer 2, the surface thereof may be roughened by a dry process and/or a wet process for the purpose of improving the adhesion thereof to the conductive substance-adsorbing resin layer or to its precursor layer to be formed thereon. The dry roughening process may be mechanical polishing such as buffing or sand blasting and plasma etching. The wet roughening process may be chemical treatment with oxidizers such as permanganates, bichromates, ozone, hydrogen peroxide/sulfuric acid, or nitric acid, strong bases, or resin-swelling solvents.

(Conductive Substance-Adsorbing Resin Precursor Layer)

The conductive substance-adsorbing resin precursor layer in the invention contains a compound having a functional group capable of adsorbing metal ions or metal fine particles (hereinafter referred to sometimes as metal-adsorbing functional group). In addition, this compound preferably also has a reactive functional group capable of producing chemical bonding to an active site which upon applying energy, is generated on the resin support 1 or the adhesion assist layer 2. Specific examples of the reactive compound contained in the conductive substance-adsorbing resin precursor layer include reactive compounds such as compounds (polymerizable compounds) capable of forming graft polymers by applying energy such as light exposure and compounds which can, by energy application, form a crosslinking structure or the like between adjacent layers to improve the adhesion between the layers. Polymer compounds formed by these reactive compounds are those that adsorb metal ions or metal fine particles, and thus the reactive compounds are preferably those having both "radically polymerizable unsaturated double bond" that is a partial structure which is capable of polymerization reaction or forming a crosslinking structure and which is necessary for binding to the adhesion assist layer 2 and "metal-adsorbing functional group" that is necessary for adsorbing metal ions or metal fine particles.

Typical examples of the reactive compound include polymerizable compounds capable of polymerization reaction. The polymerizable compound is a compound having a radically polymerizable unsaturated double bond in a molecule.

—Radically Polymerizable Unsaturated Double Bond—

A functional group containing "a radically polymerizable unsaturated double bond" may be a vinyl group, a vinyloxy group, an allyl group, an acryloyl group, a methacryloyl group, etc. Among these groups, an acryloyl group and a methacryloyl group are highly reactive to give good results.

The radically polymerizable unsaturated compound may be any compound having a radically polymerizable group; for example, a monomer or macromer having an acrylate group, a methacrylate group or a vinyl group and an oligomer or polymer having a polymerizable unsaturated group may be used.

Other examples of the reactive compound include oligomer or polymer compounds having a reactive active group in a molecule, for example, an oxetane group, an epoxy group, an isocyanate group, an active hydrogen-containing functional group, and an active group in an azo compound, or a combination of a crosslinking agent and a crosslinkable compound.

The reactive compound is preferably one possessing the above functional group and having a weight-average molecular weight of 1000 or more, more preferably 2000 or more, even more preferably 3000 or more. When the weight-average molecular weight is 1000 or less, the reactive compound, upon formation of the conductive substance-adsorbing resin precursor layer, easily evaporates, liquefies, or diffuses into the adhesion assist layer 2 and is thus hardly uniformly exposed to light. The weight-average molecular weight is preferably 300,000 or less, more preferably 200,000 or less, even more preferably 100,000 or less. When the weight-average molecular weight is 300,000 or more, the conductive substance-adsorbing resin precursor layer hardly forms bonding due to poor reactivity to active sites and cannot sufficiently adhere to the adhesion assist layer 2 or the resin film.

Depending on the intended object, the conductive substance-adsorbing resin precursor layer can contain, for example, various compounds for improving film properties, such as a binder, a plasticizer, a surfactant and a viscosity regulator, in addition to the reactive compound described above, as long as the effect of the invention is not impaired. The amount of the reactive compound in the conductive substance-adsorbing resin precursor layer before energy application is preferably 50% by weight or more, more preferably 60% or more, even more preferably 70% by weight or more. When the amount of the reactive compound is 50% by weight or less, the reaction to active sites is deteriorated, resulting in deterioration in the effect of the invention.

—Metal-Adsorbing Functional Group—

The reactive compound should further have a metal-adsorbing functional group that is a partial structure capable of adsorbing metal ions or metal fine particles.

The functional group capable of interacting with metal ions or metal fine particles may be a functional group having a positive charge, such as ammonium, phosphonium, or the like, and an acidic group having a negative charge or dissociable to have a negative charge, such as a sulfonic acid group, a carboxyl group, a phosphoric acid group, a phosphonic acid group, or the like. These functional groups adsorb metal ions or metal fine particles in the form of counter ions of their dissociated groups. Besides, a functional group not generating a proton by dissociation may also be used. Specifically, such an interacting group is preferably a group capable of forming multidentate coordination, a nitrogen-containing functional group, a sulfur-containing group, or an oxygen-containing functional group.

Specific examples of the nitrogen-containing functional group include an imidazole group, an imino group, an imido group, an urea group, a pyridine group, a primary to tertiary amino group, an ammonium group, a pyrrolidone group, an amido group, an amidino group, a triazine ring structure-containing functional group, an isocyanuric structure-containing functional group, an urethane group, a nitro group, a nitroso group, an azo group, a diazo group, an azido group, a cyano group, a cyanato group (R—O—CN), and the like; examples of the oxygen-containing group include a hydroxyl group (including phenol), an ether group, a carbonyl group, an ester group, an N-oxide structure-containing functional group, an S-oxide structure-containing functional group, an N-hydroxy structure-containing functional group, and the like; and examples of the sulfur-containing functional group include a thiol group, a thioether group, a thiourea group, a thioxy group, a sulfoxido group, a sulfone group, a sulfite group, a sulfoxyimine structure-containing functional group, a sulfoxynium salt structure-containing functional group, a sulfonate structure-containing functional group, and the like. Other preferable functional groups include a phosphorus-containing group such as a phosphine group, the above-mentioned acid group having a negative charge or dissociable to have a negative charge, such as a carboxylic acid group, a sulfonic acid group, a phosphoric acid group, or the like, a functional group containing a halogen atom such as chlorine or bromine, and an unsaturated ethylene group. Because of high polarity and high adsorption ability to a plating catalyst or the like, a functional group containing a structure represented by —O—(CH$_2$)$_n$—O— wherein n is an integer of 1 to 5, or a cyano group, is preferable, and a cyano group can be mentioned as most preferable.

From the viewpoint of physical properties, a nonionic polar group such as a hydroxyl group, an amido group, a sulfonamido group, an alkoxy group, and the like, a functional group capable of having a chelation or multidentate coordination structure thereby interacting with metal ions or metal fine particles and adsorbing the metal or metal fine particles, and a functional group capable of inclusion, represented by crown ether, can also be used. Further examples include a functional group which interacts with a solvent held in a form typified by water of crystallization and which is capable of adsorbing a metal in such a form as to be dissolved as a salt in a solvent to be held or adsorbed.

Specifically, there is (1) a method wherein metal ions are adsorbed to a graft polymer consisting of a compound having a polar group (ionic group) that is a functional group capable of interacting with a conductive material or (2) a method wherein a graft polymer consisting of a nitrogen- or sulfur-containing polymer (for example, polyvinyl pyrrolidone, polyvinyl pyridine or polyvinyl imidazole) showing high affinity for a metal salt through its functional group capable of interacting with a conductive material is impregnated with metal salts or a solution containing metal salts.

The functional group capable of interacting with metal ions or metal fine particles can be allowed to easily interact with a specific metal. Specifically, the inclusion site of an inclusion compound can be adjusted in size to a specific ion, or the structure of a multidentate ligand can be fixed so as to be coordinated with a specific ion.

The specific compound having both the "radically polymerizable unsaturated double bond" and the "metal-adsorbing functional group" described later which is necessary for adsorbing metal ions or metal fine particles may be the following reactive compounds.

Particularly preferable examples of such reactive compounds are shown below, but the invention is not limited thereto.

In the invention, the reactive copolymer used in formation of the metal-adsorbing resin precursor layer can be a copolymer containing a unit represented by formula (1) below and a unit represented by formula (2) below. In the following description, this copolymer will be referred to as "cyano group-containing polymerizable polymer".

Formula (1)

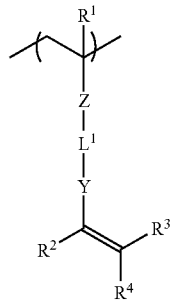

Formula (2)

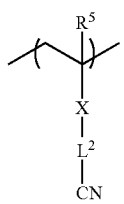

In formulae (1) and (2), $R^1$ to $R^5$ each independently represent a hydrogen atom or a substituted or unsubstituted alkyl group, X, Y and Z each independently represent a single bond, a substituted or unsubstituted divalent organic group, an ester group, an amido group or an ether group, and $L^1$ and $L^2$ each independently represent a substituted or unsubstituted divalent organic group.

When $R^1$ to $R^5$ each represent a substituted or unsubstituted alkyl group, the unsubstituted alkyl group may be a methyl group, an ethyl group, a propyl group, and a butyl group, and the substituted alkyl group may be methyl, ethyl, propyl and butyl groups which are substituted with a methoxy group, a hydroxy group, a chlorine atom, a bromine atom, a fluorine atom etc.

$R^1$ is preferably a hydrogen atom, a methyl group, a hydroxy group, or a methyl group substituted with a bromine atom.

$R^2$ is preferably a hydrogen atom, a methyl group, a hydroxy group, or a methyl group substituted with a bromine atom.

$R^3$ is preferably a hydrogen atom.
$R^4$ is preferably a hydrogen atom.
$R^5$ is preferably a hydrogen atom or a methyl group.

When X, Y and Z each represent a substituted or unsubstituted divalent organic group, the divalent organic group may be a substituted or unsubstituted aliphatic hydrocarbon group and a substituted or unsubstituted aromatic hydrocarbon group.

The substituted or unsubstituted aliphatic hydrocarbon group may be a methylene group, an ethylene group, a propylene group and a butylene group, each of which may be substituted with a methoxy group, a hydroxy group, a chlorine atom, a bromine atom, a fluorine atom or the like.

The substituted or unsubstituted aromatic hydrocarbon group is preferably an unsubstituted phenyl group or a phenyl group substituted with a methoxy group, a hydroxy group, a chlorine atom, a bromine atom, a fluorine atom or the like.

In particular, —$(CH_2)_n$— wherein n is an integer of 1 to 3 is preferable, and —$CH_2$— is more preferable.

$L^1$ is preferably a divalent organic group having an urethane linkage or an urea linkage, more preferably one having 1 to 9 carbon atoms in total. The number of carbon atoms in total in $L^1$ means the total number of carbon atoms contained in the substituted or unsubstituted divalent organic group represented by $L^1$.

More specifically, the structure of $L^1$ is preferably a structure represented by the following formula (1-1) or (1-2):

Formula (1-1)

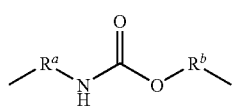

Formula (1-2)

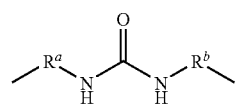

In the formulae (1-1) and (1-2), $R^a$ and $R^b$ each independently represent a substituted or unsubstituted methylene, ethylene, propylene or butylene group.

$L^2$ is preferably a linear, branched or cyclic alkylene group, an aromatic group, or a combined group thereof. The combined group of the alkylene group and the aromatic group may further have an ether group, an ester group, an amido group, an urethane group or an urea group between the alkylene group and the aromatic group. $L^2$ is preferably a group having 1 to 15 carbon atoms in total, particularly preferably an unsubstituted group. The number of carbon atoms in total in $L^2$ means the total number of carbon atoms contained in the substituted or unsubstituted divalent organic group represented by $L^2$.

Specific examples include a methylene group, an ethylene group, a propylene group, a butylene group and a phenylene group, each of which may be substituted with a methoxy group, a hydroxy group, a chlorine atom, a bromine atom, a fluorine atom or the like, and a combined group thereof.

In the cyano group-containing polymerizable polymer in the invention, the unit represented by the formula (1) is preferably a unit represented by the following formula (3):

Formula (3)

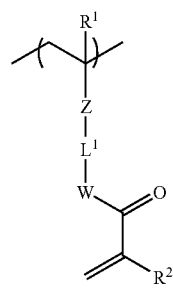

In the formula (3), $R^1$ and $R^2$ each independently represent a hydrogen atom or a substituted or unsubstituted alkyl group, Z represents a single bond, a substituted or unsubstituted divalent organic group, an ester group, an amido group or an ether group, W represents a nitrogen atom or an oxygen atom, and $L^1$ represents a substituted or unsubstituted divalent organic group.

$R^1$ and $R^2$ in the formula (3) have the same meanings as defined for $R^1$ and $R^2$ in the formula (1), and preferable examples are also the same as defined therein.

Z in the formula (3) has the same meaning as defined for Z in the formula (1), and preferable examples are also the same as defined therein.

$L^1$ in the formula (3) has the same meaning as defined for $L^1$ in the formula (1), and preferable examples are also the same as defined therein.

In the cyano group-containing polymerizable polymer, the unit represented by the formula (3) is preferably a unit represented by the following formula (4):

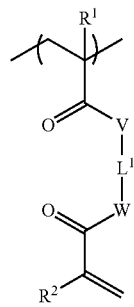

Formula (4)

In the formula (4), $R^1$ and $R^2$ each independently represent a hydrogen atom or a substituted or unsubstituted alkyl group, V and W each independently represent a nitrogen atom or an oxygen atom, and $L^1$ represents a substituted or unsubstituted divalent organic group.

$R^1$ and $R^2$ in the formula (4) have the same meanings as defined for $R^1$ and $R^2$ in the formula (1), and preferable examples are also the same as defined therein.

$L^1$ in the formula (4) has the same meaning as defined for $L^1$ in the formula (1), and preferable examples are also the same as defined therein.

In the formulae (3) and (4), W is preferably an oxygen atom.

In the formulae (3) and (4), $L^1$ is preferably an unsubstituted alkylene group or a divalent organic group having an urethane linkage or an urea linkage, more preferably the one having 1 to 9 carbon atoms in total.

In the cyano group-containing polymerizable polymer, the unit represented by the formula (2) is preferably a unit represented by the following formula (5):

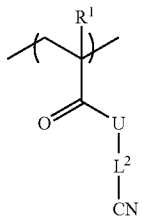

Formula (5)

In the formula (5), $R^2$ represents a hydrogen atom or a substituted or unsubstituted alkyl group, U represents a nitrogen atom or an oxygen atom, and $L^2$ represents a substituted or unsubstituted divalent organic group.

$R^2$ in the formula (5) has the same meaning as defined for $R^1$ and $R^2$ in the formula (1), and is preferably a hydrogen atom.

$L^2$ in the formula (5) has the same meaning as defined for $L^2$ in the formula (1), and is preferably a linear, branched or cyclic alkylene group, an aromatic group, or a combined group thereof.

Particularly, in the formula (5), $L^2$ is preferably a divalent organic group having a linear, branched or cyclic alkylene group at the site linking with a cyano group, and particularly this divalent organic group preferably has 1 to 10 carbon atoms in total.

In another preferable embodiment, $L^2$ in the formula (5) is preferably a divalent organic group having an aromatic group at the site linking with a cyano group, and particularly this divalent organic group preferably has 6 to 15 carbon atoms in total.

The cyano group-containing polymerizable polymer is a polymer which contains the units represented by the formulae (1) to (5) and which has a polymerizable group and a cyano group in a side chain.

The cyano group-containing polymerizable polymer can be synthesized for example in the following manner.

The type of polymerization reaction may be radical polymerization, cation polymerization and anion polymerization. From the viewpoint of reaction control, radical polymerization or cation polymerization is preferably used.

The method of synthesizing the cyano group-containing polymerizable polymer is different between the case (1) where the polymerization mode of forming a polymer main chain is different from the polymerization mode of a polymerizable group introduced into a side chain, and the case (2) where the polymerization mode of forming a polymer main chain is the same as the polymerization mode of a polymerizable group introduced into a side chain.

Case (1) where the polymerization mode of forming a polymer main chain is different from the polymerization mode of a polymerizable group introduced into a side chain:

When the polymerization mode of forming a polymer main chain is different from the polymerization mode of a polymerizable group introduced into a side chain, there are the embodiment (1-1) where the formation of a polymer main chain is conducted by cation polymerization and the polymerization mode of a polymerizable group introduced into a side chain is radical polymerization, and the embodiment (1-2) where the formation of a polymer main chain is conducted by radical polymerization and the polymerization mode of a polymerizable group introduced into a side chain is cation polymerization.

Embodiment (1-1) where the formation of a polymer main chain is conducted by cation polymerization and the polymerization mode of a polymerizable group introduced into a side chain is radical polymerization In the invention, the monomers used in the embodiment where the formation of a polymer main chain is conducted by cation polymerization and the polymerization mode of a polymerizable group introduced into a side chain is radical polymerization include the following compounds.

Monomers Used in Forming the Polymerizable Group-Containing Unit

The monomers used in forming the polymerizable group-containing unit in this embodiment include vinyl (meth)acrylate, allyl (meth)acrylate, 4-(meth)acryloyl butane vinyl ether, 2-(meth)acryloyl ethane vinyl ether, 3-(meth)acryloyl propane vinyl ether, (meth)acryloyloxy diethylene glycol vinyl ether, (meth)acryloyloxy triethylene glycol vinyl ether, (meth)acryloyl 1st terpineol, 1-(meth)acryloyloxy-2-methyl-2-propene, 1-(meth)acryloyloxy-3-methyl-3-butene, 3-methylene-2-(meth)acryloyloxy-norbornane, 4,4'-ethylidenediphenol di(meth)acrylate, methacrolein di(meth)acryloyl acetal, p-((meth)acryloylmethyl)styrene, allyl (meth)acrylate, vinyl 2-(bromomethyl)acrylate, and allyl 2-(hydroxymethyl)acrylate.

Monomers Used in Forming the Cyano Group-Containing Unit

The monomers used in forming the cyano group-containing unit in this embodiment include 2-cyanoethyl vinyl ether, cyanomethyl vinyl ether, 3-cyanopropyl vinyl ether, 4-cyanobutyl vinyl ether, 1-(p-cyanophenoxy)-2-vinyloxyethane, 1-(o-cyanophenoxy)-2-vinyloxy-ethane, 1-(m-cyanophenoxy)-2-vinyloxy-ethane, 1-(p-cyanophenoxy)-3-vinyloxy-propane, 1-(p-cyanophenoxy)-4-vinyloxy-butane, o-cyanobenzyl vinyl ether, m-cyanobenzyl vinyl ether, p-cyanobenzyl vinyl ether, allyl cyanide, allylcyanoacetic acid, and the following compounds:

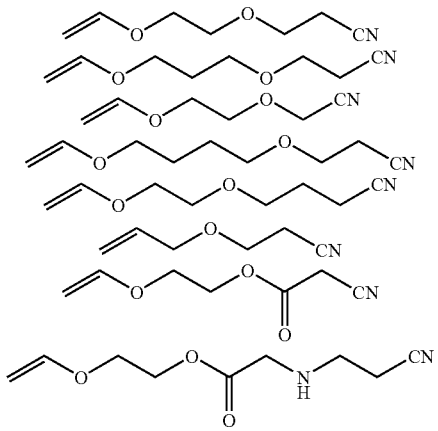

The polymerization method may be a method described in "Jikken Kagaku Koza, Kobunshi Kagaku (Experimental Chemical Course, Polymer Chemistry)", chap. 2-4, p. 74 and a general cation polymerization method described in "Kobunshi Gosei No Jikkenhouhou (Experimental Methods in Polymer Synthesis)" authored by Takayuki Otsu, chap. 7, p. 195. In cation polymerization, a protonic acid, a metal halide, an organometal compound, an organic salt, a metal oxide, a solid acid and a halogen can be used as initiators, among which a metal halide and an organometallic compound are preferably used as highly active initiators capable of synthesizing high-molecular-weight polymers.

Specific examples include boron trifluoride, boron trichloride, aluminum chloride, aluminum bromide, titanium tetrachloride, tin tetrachloride, tin bromide, phosphorus pentafluoride, antimony chloride, molybdenum chloride, tungsten chloride, iron chloride, dichloroethyl aluminum, chlorodiethyl aluminum, dichloromethyl aluminum, chlorodimethyl aluminum, trimethyl aluminum, trimethyl zinc, and methyl Grignard.

Embodiment (1-2) where the formation of a polymer main chain is conducted by radical polymerization and the polymerization mode of a polymerizable group introduced into a side chain is cation polymerization In the invention, the monomers used in the embodiment where the formation of a polymer main chain is conducted by radical polymerization and the polymerization mode of a polymerizable group introduced into a side chain is cation polymerization include the following compounds.

Monomers Used in Forming the Polymerizable Group-Containing Unit

The same monomers as used in forming the polymerizable group-containing unit mentioned in the embodiment (1-1) can be used.

Monomers Used in Forming the Cyano Group-Containing Unit

The monomers used in forming the nitrile group-containing unit in this embodiment include cyanomethyl (meth)acrylate, 2-cyanoethyl (meth)acrylate, 3-cyanopropyl (meth)acrylate, 2-cyanopropyl (meth)acrylate, 1-cyanoethyl (meth)acrylate, 4-cyanobutyl (meth)acrylate, 5-cyanopentyl (meth)acrylate, 6-cyanohexyl (meth)acrylate, 7-cyanohexyl (meth)acrylate, 8-cyanohexyl (meth)acrylate, 2-cyenoethyl-(3-(bromomethyl)acrylate), 2-cyenoethyl-(3-(hydroxymethyl)acrylate), p-cyanophenyl (meth)acrylate, o-cyanophenyl (meth)acrylate, m-cyanophenyl (meth)acrylate, 5-(meth)acryloyl-2-carbonitrilo-norbornene, 6-(meth)acryloyl-2-carbonitrilo-norbornene, 1-cyano-1-(meth)acryloyl-cyclohexane, 1,1-dimethyl-1-cyano-(meth)acrylate, 1-dimethyl-1-ethyl-1-cyano-(meth)acrylate, o-cyanobenzyl (meth)acrylate, m-cyanobenzyl (meth)acrylate, p-cyanobenzyl (meth)acrylate, 1-cyanocycloheptyl acrylate, 2-cyanophenyl acrylate, 3-cyanophenyl acrylate, vinyl cyanoacetate, vinyl 1-cyano-1-cyclopropanecarboxylate, allyl cyanoacetate, allyl 1-cyano-1-cyclopropanecarboxylate, N,N-dicyanomethyl (meth)acrylamide, N-cyanophenyl (meth)acrylamide, allyl cyanomethyl ether, allyl-o-cyanoethyl ether, allyl-m-cyanobenzyl ether, and allyl-p-cyanobenzyl ether.

A monomer having a structure in which hydrogen atoms of the above-mentioned monomer is partially substituted with a hydroxyl group, an alkoxy group, a halogen atom or a cyano group can also be used.

The polymerization method may be a method described in "Jikken Kagaku Koza, Kobunshi Kagaku (Experimental Chemical Course, Polymer Chemistry)", chap. 2-2, p. 34 and a general radical polymerization method described in "Kobunshi Gosei No Jikkenhouhou (Experimental Methods in Polymer Synthesis)" authored by Takayuki Otsu, chap. 5, p. 125. Known radical polymerization initiators include a high-temperature initiator necessary for heating at 100° C. or more, a usual initiator that initiates polymerization by heating at 40 to 100° C., and a redox initiator that initiates polymerization at very low temperature, among which the usual initiator is preferable from the viewpoint of stability of the initiator and easy handling of polymerization reaction.

The usual initiator may be benzoyl peroxide, lauroyl peroxide, peroxodisulfate, azobisisobutyronitrile, and azobis-2,4-dimethylvaleronitrile.

Case (2) where the polymerization mode of forming a polymer main chain is the same as the polymerization mode of a polymerizable group introduced into a side chain.

When the polymerization mode of forming a polymer main chain is the same as the polymerization mode of a polymerizable group introduced into a side chain, there are the embodiment (2-1) wherein both the polymerization modes are cation polymerization and the embodiment (2-2) wherein both the polymerization modes are radical polymerization.

Embodiment (2-1) wherein both the polymerization modes are cation polymerization In the embodiment (2-1) where both the polymerization modes are cation polymerization, the monomer having a cyano group may be the same as the monomer used in forming the nitrile group-containing unit mentioned in the embodiment (1-1) above.

From the viewpoint of preventing gelation during polymerization, it is preferable to use a method wherein the polymer having a cyano group is previously synthesized and then reacted with a compound having a polymerizable group (hereinafter referred to sometimes as "reactive compound") thereby introducing the polymerizable group into the polymer.

To react with the reactive compound, the polymer having a cyano group preferably has a reactive group shown below.

Preferably the polymer having a cyano group and the reactive compound are selected appropriately so as to have the following combination of functional groups.

The combination may be specifically (reactive group of the polymer, functional group of the reactive compound)=(carboxyl group, carboxyl group), (carboxyl group, epoxy group), (carboxyl group, isocyanate group), (carboxyl group, benzyl halide), (hydroxyl group, carboxyl group), (hydroxyl group, epoxy group), (hydroxyl group, isocyanato group), (hydroxyl group, benzyl halide) (isocyanato group, hydroxyl group), (isocyanato group, carboxyl group), etc.

Specific examples of the reactive compound to be reacted with the polymer having a cyano group include the following compounds:

That is, examples include allyl alcohol, 4-hydroxybutane vinyl ether, 2-hydroxyethane vinyl ether, 3-hydroxpropane vinyl ether, hydroxy triethylene glycol vinyl ether, 1st terpineol, 2-methyl-2-propenol, 3-methyl-3-butenol, 3-methylene-2-hydroxy-norbornane, and p-(chloromethyl)styrene.

Embodiment (2-2) wherein both the polymerization modes are radical polymerization In the embodiment wherein both the polymerization modes are radial polymerization, the synthesis method may be a method (i) wherein a monomer having a cyano group is copolymerized with a monomer having a polymerizable group, a method (ii) wherein a monomer having a cyano group is copolymerized with a monomer having a double bond precursor and then treated with a base or the like to introduce a double bond into the product, and a method (iii) wherein a polymer having a cyano group is reacted with a monomer having a polymerizable group thereby introducing a double bond (introducing the polymerizable group) into the polymer. Among these methods, the method (ii) wherein a monomer having a cyano group is copolymerized with a monomer having a double bond precursor and then treated with a base or the like to introduce a double bond into the product and a method (iii) wherein a polymer having a cyano group is reacted with a monomer having a polymerizable group thereby introducing the polymerizable group into the polymer are preferable from the viewpoint of synthesis adaptability.

Examples of the monomer having a polymerizable group, used in the synthesis method (i), include allyl (meth)acrylate and the following compounds:

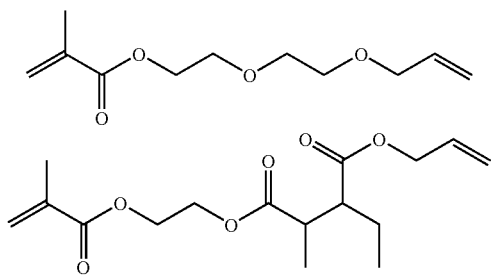

Examples of the monomer having a double bond precursor, used in the synthesis method (ii), include, for example, compounds represented by the following formula (a):

Formula (a)

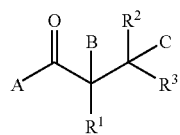

In the formula (a), A is an organic group having a polymerizable group, $R^1$ to $R^3$ each independently represent a hydrogen atom or a monovalent organic group, and B and C each represent an eliminating group to be removed by an elimination reaction. The elimination reaction as used herein refers to a reaction in which C is abstracted by the action of a base and B is eliminated. B and C are preferably eliminated as an anion and a cation, respectively.

Specific examples of the compounds represented by the formula (a) include the following compounds.

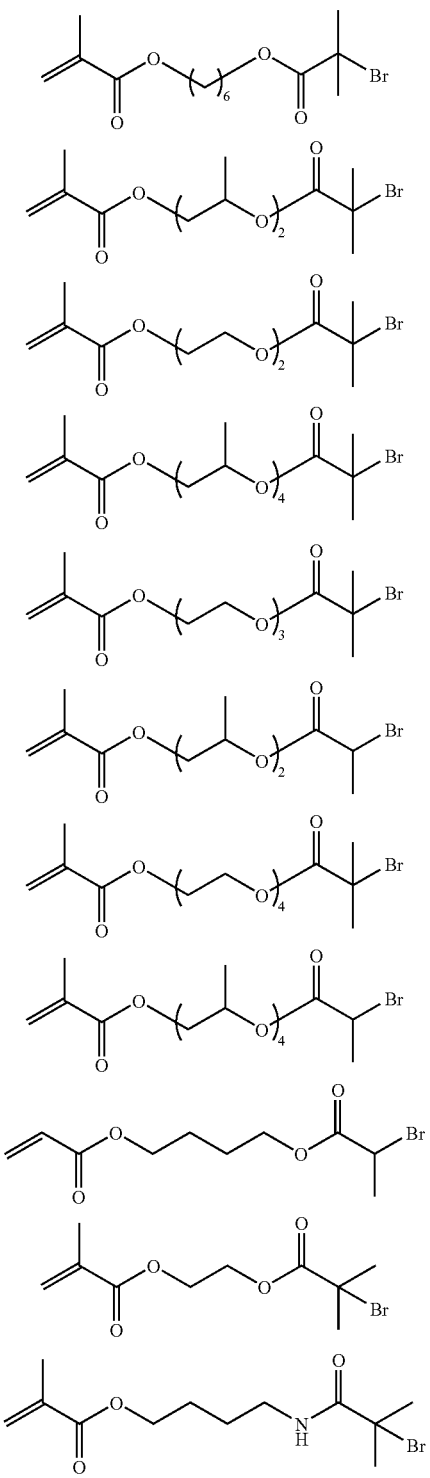

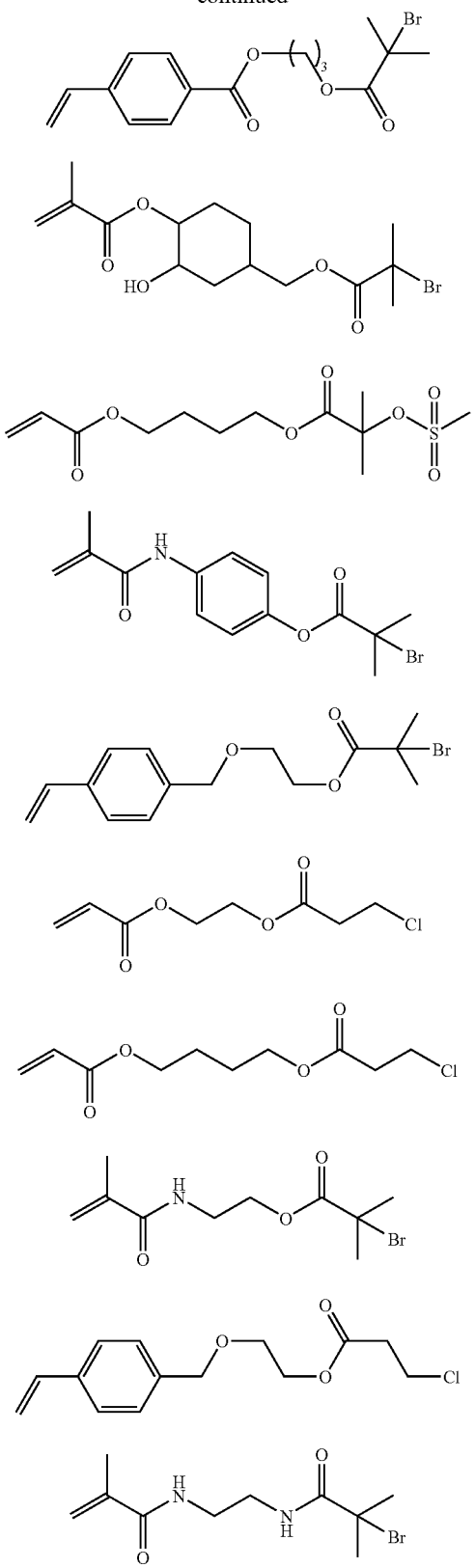

For converting the double bond precursor into a double bond in the synthesis method (ii), a method as shown below wherein the eliminating groups represented by B and C are removed by the elimination reaction; that is, the reaction wherein C is abstracted by the action of a base and B is eliminated is used.

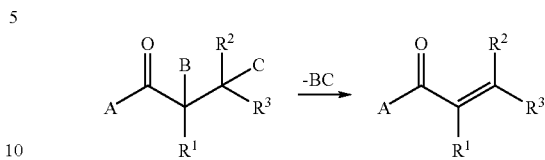

The base used in the elimination reaction is preferably an alkali metal hydride, an alkali metal hydroxide, an alkali metal carbonate, an organic amine compound, or a metal alkoxide compound. Preferable examples of the hydride, hydroxide, and carbonate of an alkali metal include sodium hydride, calcium hydride, potassium hydride, sodium hydroxide, potassium hydroxide, calcium hydroxide, potassium carbonate, sodium carbonate, potassium hydrogen carbonate, and sodium hydrogen carbonate. Examples of the organic amine compound include trimethylamine, triethylamine, diethylmethylamine, tributylamine, triisobutylamine, trihexylamine, trioctylamine, N,N-dimethylcyclohexylamine, N,N-diethylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperidine, 2,2,6,6-tetramethylpiperidine, piperazine, 1,4-dimethylpiperazine, quinuclidine, 1,4-diazabicyclo[2,2,2]-octane, hexamethylenetetramine, morpholine, 4-methylmorpholine, pyridine, picoline, 4-dimethylaminopyridine, lutidine, 1,8-diazabicyclo[5,4,0]-7-undecene (DBU), N,N'-dicyclohexylcarbodiimide (DCC), diisopropylethylamine, and a Schiff base. Preferable examples of the metal alkoxide compound include sodium methoxide, sodium ethoxide, and potassium t-butoxide. Only a single base may be used, or a mixture of two or more bases may be used.

In the elimination reaction, examples of the solvent used for adding the base include, for example, ethylene dichloride, cyclohexanone, methyl ethyl ketone, acetone, methanol, ethanol, propanol, butanol, ethyleneglycol monomethyl ether, ethyleneglycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, ethyl lactate, and water. Only a single type of solvent may be used, or two or more types of solvents may be used in combination.

The amount of the base used may be not more than or not less than the equivalent of the specific functional groups (eliminating groups represented by B and C) in the compound. When an excess of the base is used, it is preferable to add an acid or the like after the elimination reaction so as to remove an excess of the base.

In the synthesis method (iii) above, the monomer having a polymerizable group, which is reacted with the polymer having a cyano group, varies depending on the type of the reactive group in the polymer having a cyano group, but monomers having the following combination of functional groups can be used.

That is, (reactive group of the polymer, functional group of the monomer)=(carboxyl group, carboxyl group), (carboxyl group, epoxy group), (carboxyl group, isocyanato group), (carboxyl group, benzyl halide), (hydroxyl group, carboxyl group), (hydroxyl group, epoxy group), (hydroxyl group, isocyanato group), (hydroxyl group, benzyl halide) (isocyanato group, hydroxyl group), (isocyanato group, carboxyl group), etc.

Specifically, the following monomers can be used.

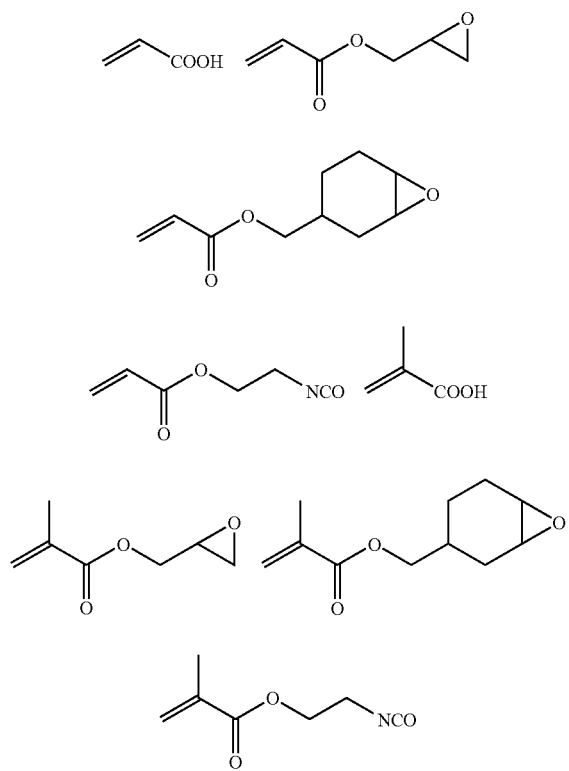

The ratio of the polymerizable group-containing unit and the cyano group-containing unit to the total amount of the copolymerization components in the polymer synthesized as described above in the invention is preferably in the following range.

That is, the polymerizable group-containing unit is contained preferably in an amount of 5 to 50 mol %, more preferably 5 to 40 mol %, based on the total amount of the copolymerization components. When the amount is 5 mol % or less, the reactivity (curability, polymerizability) is deteriorated, while when the amount is 50 mol % or more, gelation easily occurs to make polymerization difficult.

The cyano group-containing unit is contained preferably in an amount of 1 to 95 mol %, more preferably 10 to 95 mol %, based on the total amount of the copolymerization components.

The polymer in the invention may contain other units in addition to the cyano group-containing unit and the polymerizable group-containing unit. The monomers used in forming other units may be any monomers as long as the effect of the invention is not impaired.

Specifically, the monomers that can be used herein may be any monomers as long as they can form, as a main-chain structure, an acryl resin skeleton, a styrene resin skeleton, a phenol resin (phenol/formaldehyde resin) skeleton, a melamine resin (melamine/formaldehyde polycondensate) skeleton, a urea resin (urea/formaldehyde polycondensate) skeleton, a polyester resin skeleton, a polyurethane skeleton, a polyimide skeleton, a polyolefin skeleton, a polycycloolefin skeleton, a polystyrene skeleton, polyacrylic skeleton, an ABS resin (acrylonitrile/butadiene/styrene polymer) skeleton, a polyamide skeleton, a polyacetal skeleton, a polycarbonate skeleton, a polyphenylene ether skeleton, a polyphenylene sulfide skeleton, a polysulfone skeleton, a polyether sulfone skeleton, a polyallylate skeleton, a polyether ether ketone skeleton, and a polyamide imide skeleton.

However, when a polymerizable group is introduced by a reaction with a polymer as described above, a small amount of reactive moieties may remain if 100% introduction is difficult, and thus such remaining reactive moieties may form a third unit.

Specifically, when the polymer main chain is formed by radical polymerization, it is possible to employ unsubstituted (meth)acrylates such as ethyl (meth)acrylate, butyl (meth)acrylate, hexyl (meth)acrylate, 2-ethylhexyl (meth)acrylate, cyclohexyl (meth)acrylate, benzyl (meth)acrylate, and stearyl (meth)acrylate, halogen-substituted (meth)acrylates such as 2,2,2-trifluoroethyl (meth)acrylate, 3,3,3-trifluoropropyl (meth)acrylate, and 2-chloroethyl (meth)acrylate, ammonium group-substituted (meth)acrylates such as 2-(meth)acryloyloxyethyl trimethyl ammonium chloride, (meth)acrylamides such as butyl (meth)acrylamide, isopropyl (meth)acrylamide, octyl (meth)acrylamide, and dimethyl (meth)acrylamide, styrenes such as styrene, vinylbenzoic acid, and p-vinylbenzylammonium chloride, and vinyl compounds such as N-vinylcarbazole, vinyl acetate, N-vinylacetamide, and N-vinylcaprolactam, as well as dimethylaminoethyl (meth)acrylate, diethylaminoethyl (meth)acrylate, 2-ethylthio-ethyl (meth)acrylate, (meth)acrylic acid, and 2-hydroxyethyl (meth)acrylate.

Macromonomers obtained by using the monomers described above may also be used.

When the polymer main chain is formed by cation polymerization, it is possible to employ vinyl ethers such as ethyl vinyl ether, butyl vinyl ether, isobutyl vinyl ether, cyclohexyl vinyl ether, ethylene glycol vinyl ether, di(ethylene glycol) vinyl ether, 1,4-butanediol vinyl ether, 2-chloroethyl vinyl ether, 2-ethylhexyl vinyl ether, vinyl acetate, 2-vinyloxytetrahydropyran, vinyl benzoate, and vinyl butyrate, styrenes such as styrene, p-chlorostyrene, and p-methoxystyrene, and ethylene-terminated compounds such as allyl alcohol and 4-hydroxy-1-butene.

In the invention, the weight-average molecular weight of the polymerizable polymer is preferable 1,000 to 700,000, more preferably 2,000 to 300,000. With respect to the degree of polymerization, the polymer is preferably decamer or more, more preferably eicosamer or more. The polymer is preferably 7,000-mer or less, more preferably 3000-mer or less, still more preferably 2,000-mer or less, further more preferably 1,000-mer or less.

Specific examples of the cyano group-containing polymerizable polymer that can be used preferably in the invention include, but are not limited to, the following compounds.

The weight-average molecular weights of these specific compounds are in the range of 3,000 to 100,000.

Polymers Obtained in the Embodiment (1-1)
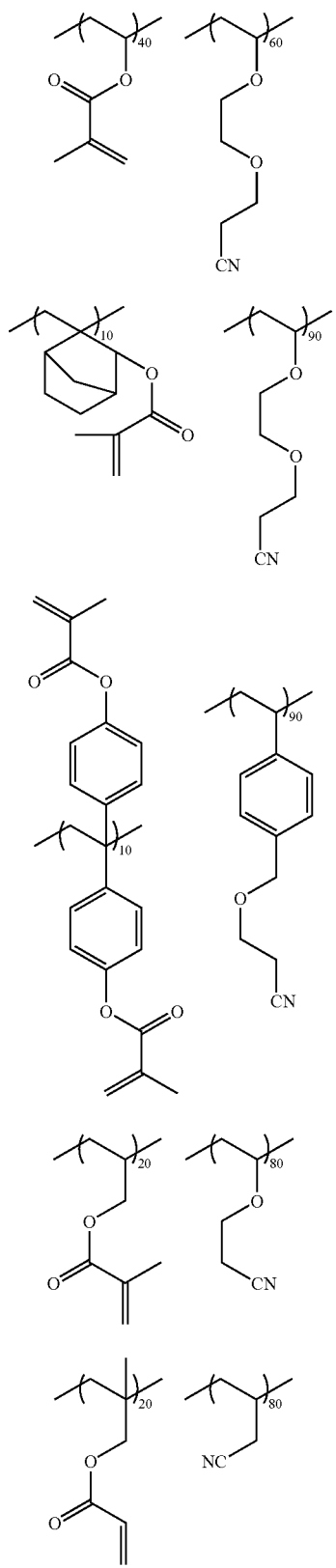
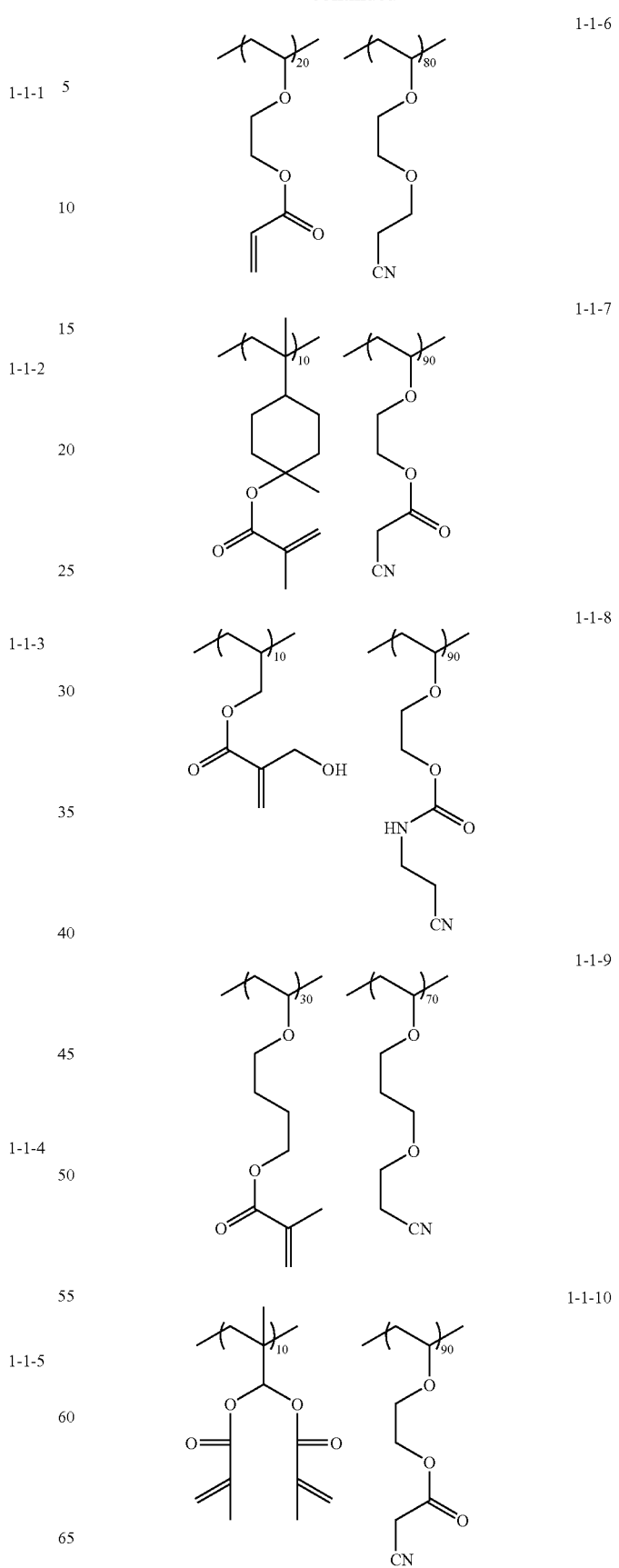

1-1-11 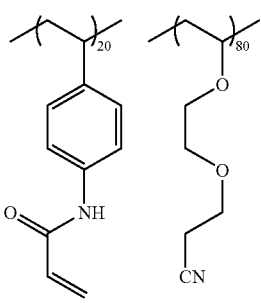
1-1-12 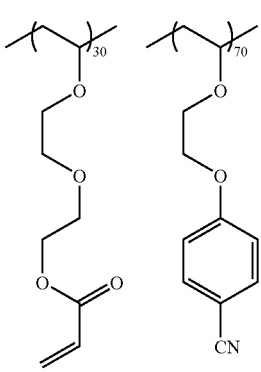
1-1-13 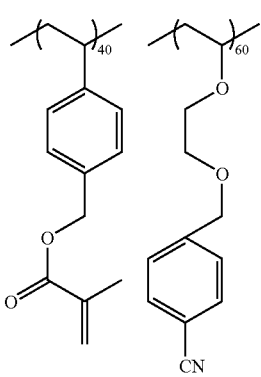
1-1-14 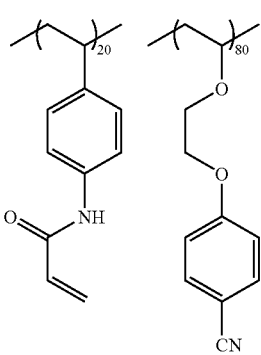
Polymers Obtained in the Embodiment (1-2)
1-2-1 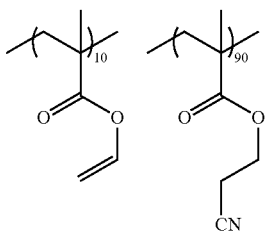
1-2-2 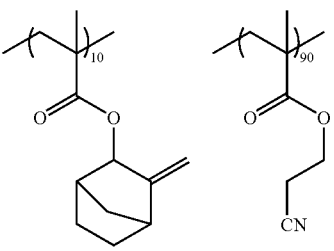
1-2-3 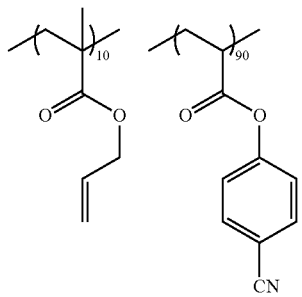
1-2-4 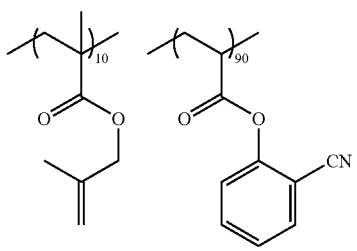
1-2-5 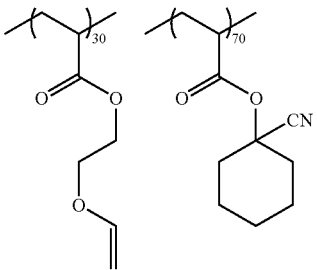

1-2-6
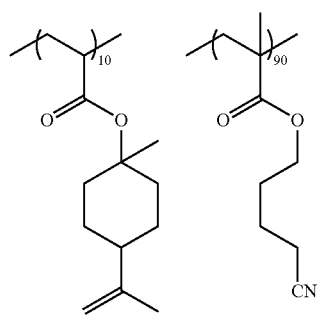
1-2-7
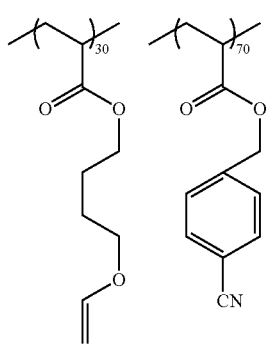
1-2-8
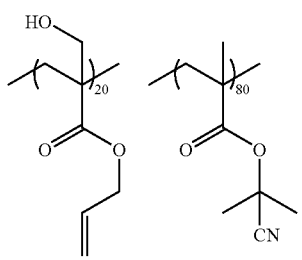
1-2-9
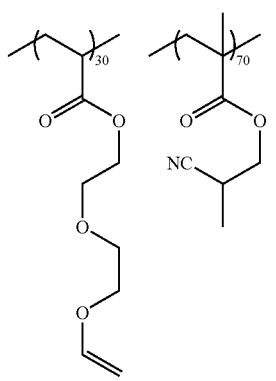
1-2-10
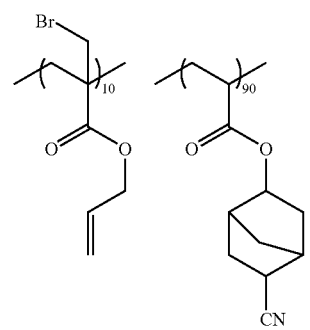
1-2-11
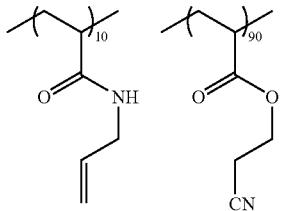
Polymers Obtained in the Embodiment (2-1)
2-1-1
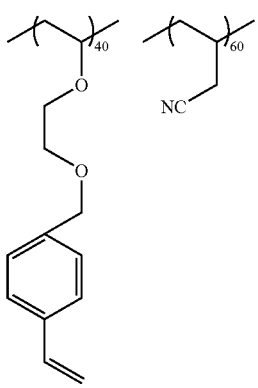
2-1-2
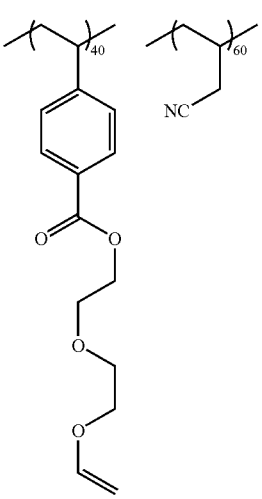
2-1-3
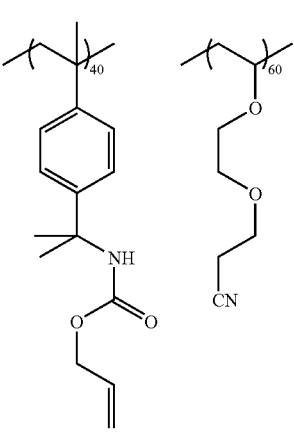

2-1-4
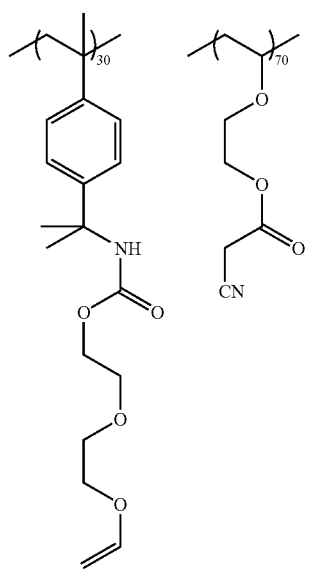
2-1-5
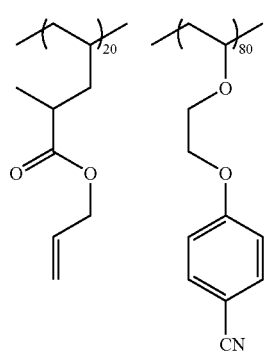
Polymers Obtained in the Embodiment (2-2)
2-2-1
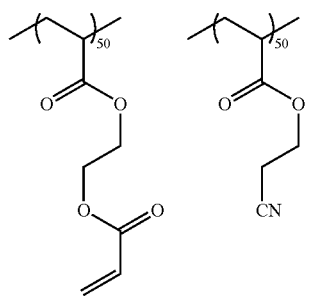
2-2-2
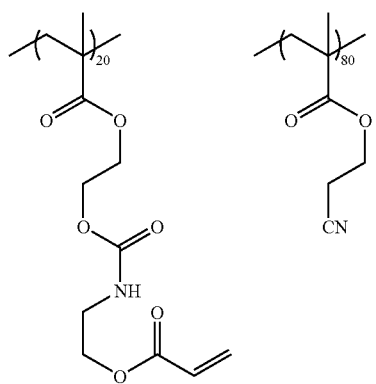
2-2-3
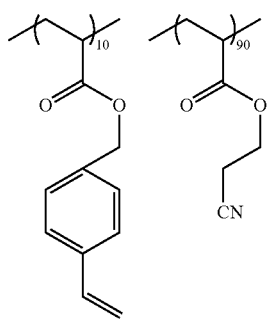
2-2-4
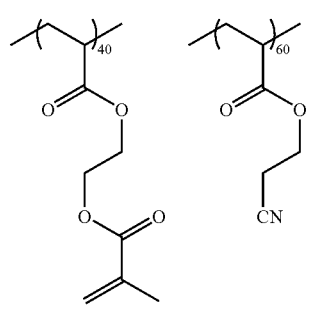
2-2-5
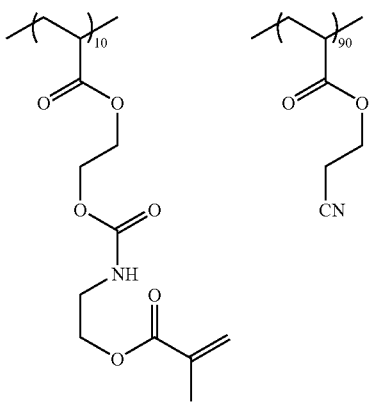
2-2-6
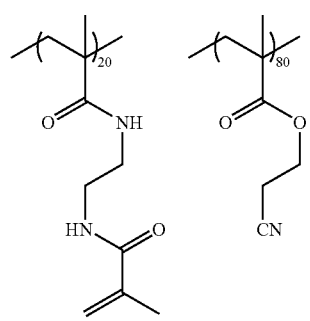

-continued
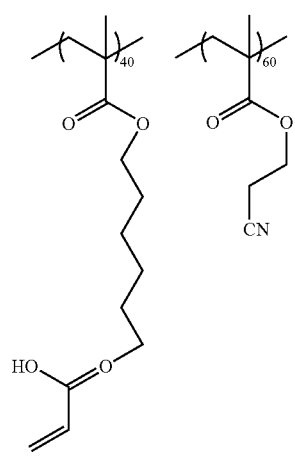
2-2-7
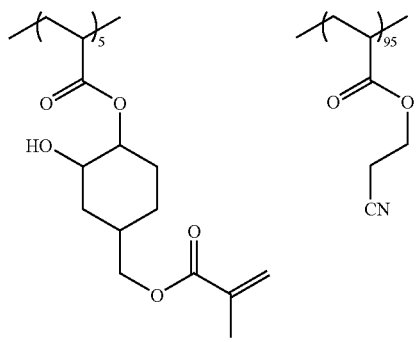
2-2-8
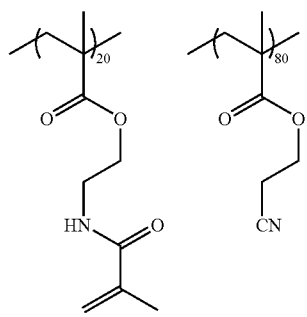
2-2-9
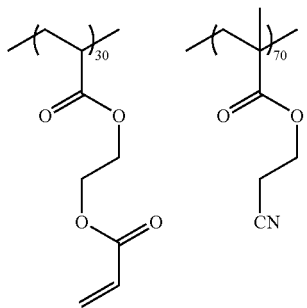
2-2-10
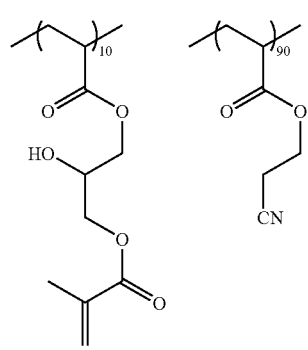
2-2-11
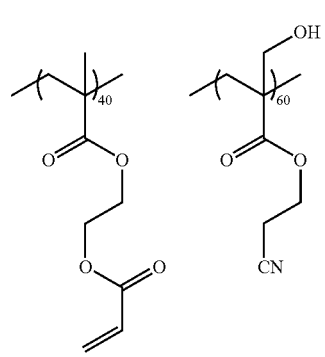
2-2-12
Polymers Obtained in the Embodiment (2-2)
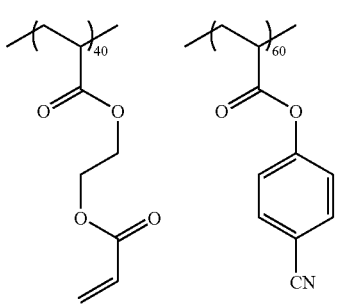
2-2-13
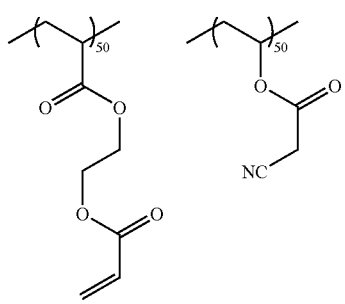
2-2-14

2-2-15
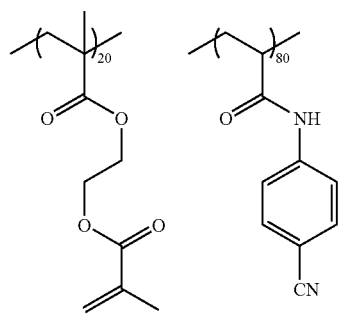
2-2-16
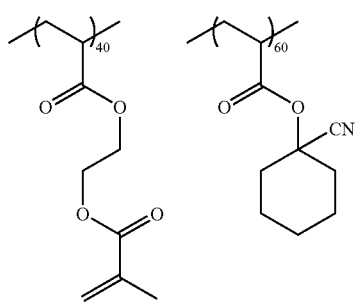
2-2-17
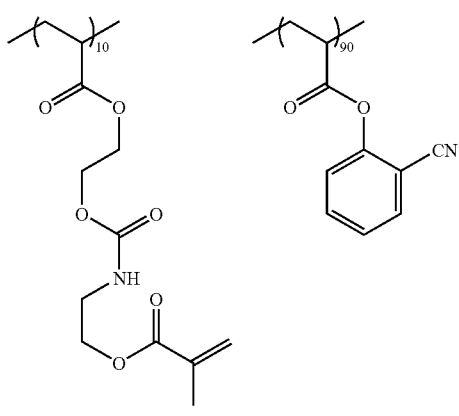
2-2-18
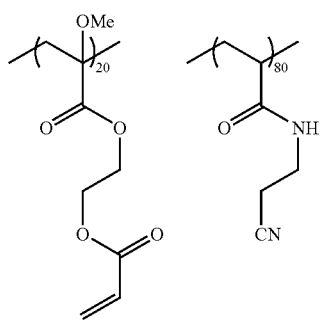
2-2-19
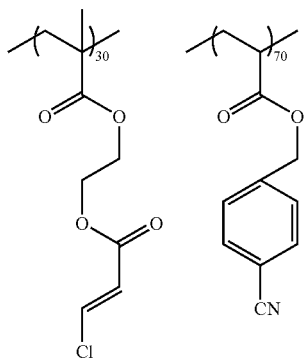
2-2-20
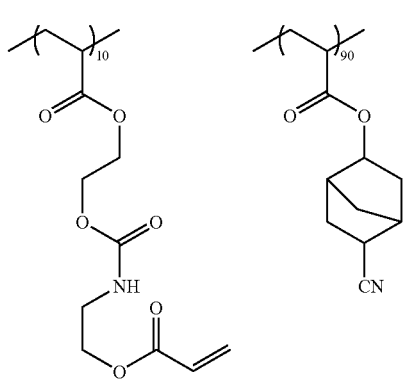
2-2-21
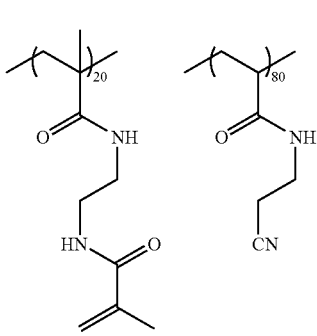
2-2-22
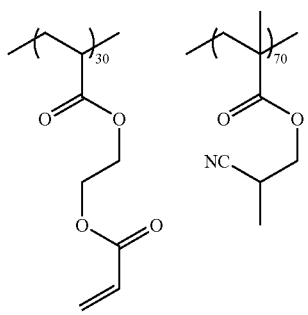

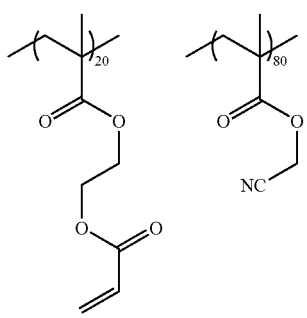

2-2-23

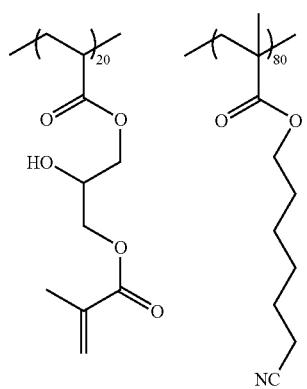

2-2-24

Polymers Obtained in the Embodiment (2-2)

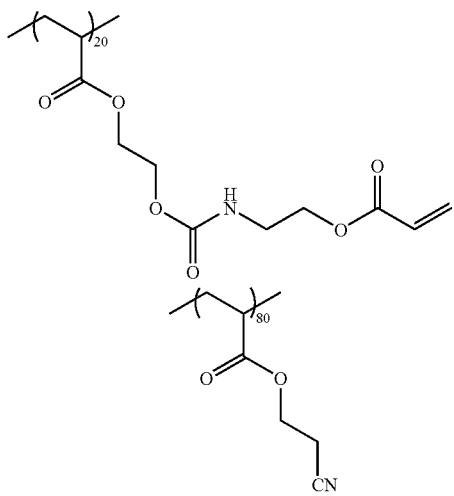

2-2-25

For example, the specific compound 2-2-11 above can be synthesized by dissolving acrylic acid and 2-cyanoethyl acrylate in N-methylpyrrolidine for example, then subjecting the solution to radical polymerization with azoisobutyronitrile (AIBN) for example as a polymerization initiator, followed by addition reaction of glycidyl methacrylate in the presence of a catalyst such as benzyltriethylammonium chloride and a polymerization inhibitor such as tertiary butyl hydroquinone.

For example, the specific compound 2-2-19 above can be synthesized by dissolving the monomer shown below and p-cyanobenzyl acrylate in a solvent such as N,N-dimethylacrylamide, then subjecting the solution to radical polymerization with a polymerization initiator such as dimethyl azoisobutyrate and then removing hydrochloric acid with a base such as triethylamine.

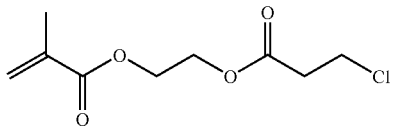

These polymerizable polymers can have not only polymerizable groups and interacting groups but also polar groups in such a range that the water absorption of the polymerizable polymers of the invention can be satisfied. By having polar groups, the adhesion of the polymerizable polymer layer to a protective layer arranged after a metal film is formed by a process described later may be improved.

When the decomposition of the polymerizable group sites of the polymerizable polymer that can be used in the invention is 50% or less when the polymer is stirred for 1 hour in, for example, a pH 12 alkaline solution, the polymerizable polymer can be washed with a highly alkaline solution.

The molecular weight (Mw) of the reactive compound that can be used in the invention is preferably 1,000 to 300,000, more preferably 2,000 to 200,000, even more preferably 3,000 to 100,000.

The amount of the reactive compound in the precursor layer-forming coating liquid composition in the state of the conductive substance-adsorbing resin precursor layer before energy application is preferably 2 to 50% by weight.

When the conductive substance-adsorbing resin precursor layer is formed by applying and drying, the content of the reactive compound in the precursor layer is preferably 50% by weight or more, more preferably 60% or more, even more preferably 70% by weight or more as a solid content. When the content of the reactive compound in the precursor layer is less than 50% by weight, the reaction to active sites is deteriorated and the effect of the invention may not be sufficiently achieved.

Depending on the object, the conductive substance-adsorbing resin precursor layer 3 can, besides the reactive compound, contain various compounds such as a polymerization inhibitor, a binder for improving film properties, a plasticizer, a surfactant and a viscosity regulator as long as the effect of the invention is not impaired.

Examples of the polymerization inhibitor which can be added if necessary to the conductive substance-adsorbing resin precursor layer 3 include hydroquinones such as hydroquinone, di-tert-butylhydroquinone, 2,5-bis(1,1,3,3-tetramethylbutyl)hydroquinone, phenols such as p-methoxyphenol and phenol, benzoquinones, free radicals such as TEMPO (2,2,6,6-tetramethyl-1-pyperidinyloxy free radical) and 4-hydroxy-TEMPO, phenothiazines, nitrosoamines such as N-nitrosophenyl hydroxyamine and its aluminum salts, and catechols.

The conductive substance-adsorbing resin precursor layer 3 may be compounded if necessary with a curing agent and/or a curing accelerator, in order to accelerate the curing of the adhesion assist layer 2 which is arranged adjacent thereto.

For example, when an epoxy compound is contained in the adhesion assist layer, example of the polyaddition type curing agent and/or curing accelerator include aliphatic polyamines, alicyclic polyamines, aromatic polyamines, polyamides, acid anhydrides, phenol, phenol novolac, polymercaptan, a compound having two or more active hydrogen atoms, and examples of the catalyst type curing agent and/or curing accelerator include aliphatic tertiary amines, aromatic tertiary amines, imidazole compounds and Lewis acid complexes.

Examples of the curing agent and curing accelerator that initiate curing with heat, light, moisture, pressure, an acid or a base include diethylene triamine, triethylene tetramine, tetraethylene pentamine, diethyl aminopropylamine, polyamide amine, mencene diamine, isophorone diamine, N-aminoethyl piperazine, 3,9-bis(3-aminopropyl)-2,4,8,10-tetraoxyspiro (5,5) undecane adduct, bis(4-amino-3-methylcyclohexyl) methane, bis(4-aminocyclohexyl)methane, m-xylene diamine, diaminodiphenyl methane, m-phenylene diamine, diaminodiphenyl sulfone, dicyan diamide, adipic acid dihydrazide, phthalic anhydride, tetrahydrophthalic anhydride, hexahydrophthalic anhydride, methyltetrahydrophthalic anhydride, methylhexahydrophthalic anhydride, methylnadic anhydride, dodecylsuccinic anhydride, chlorendic anhydride, pyromellitic anhydride, benzophenone tetracarboxylic anhydride, ethylene glycol bis(anhydrotrimellitate), methylcyclohexenetetracarboxylic anhydride, trimellitic anhydride, polyazelaic polyanhydride, phenol novolac, xylylene novolac, bis A novolac, triphenyl methane novolac, biphenyl novolac, dicyclopentadiene phenol novolac, terpene phenol novolac, polymercaptan, polysulfide, 2,4,6-tris(dimethylaminomethyl)phenol, 2,4,6-tris(dimethylaminomethyl) phenol-tri-2-ethylhexyl acid salt, benzyldimethylamine, 2-(dimethylaminomethyl)phenol 2-methylimidazole, 2-ethyl-4-methylimidazole 2-undecylimidazole, 2-heptadecylimidazole, 2-phenylimidazole, 1-benzyl-2-methylimidazole, 1-cyanoethyl-2-methylimidazole, 2,4-diamino-6-(2-methylimidazolyl-(1))-ethyl S-triazine, $BF_3$ monoethylamine complexes, Lewis acid complexes, organic acid hydrazide, diaminomaleonitrile, melamine derivatives, imidazole derivatives, polyamine salts, amineimide compounds, aromatic diazonium salts, diallyl iodonium salts, triallyl sulfonium salts, triallyl selenium salts, ketimine compounds, etc.

The curing agent and/or the curing accelerator is preferably added in an amount of 0 to about 50% by weight based on nonvolatile components remaining after removal of the solvent, from the viewpoint of coating property of the solution and adhesion to a substrate or a metal film. The curing agent and/or the curing accelerator may be added directly to the adhesion assist layer. In this case, the total amount of the curing agent and/or the curing accelerator added to the adhesion assist layer and to the layer (conductive substance-adsorbing resin layer) formed from the polymerizable polymer is preferably in the range defined above.

Further, a plasticizer, a rubber component (for example, CTBN), a flame retardant (for example, a phosphorus-based flame retardant), a diluent, a thixotropy agent, a pigment, an antifoaming agent, a leveling agent and a coupling agent may be added. These additives can be added not only to the conductive substance-adsorbing resin precursor layer 3 but also to the adhesion assist layer 2 if necessary.

These additives used as necessary and the reactive compound can be mixed appropriately thereby optimally establishing physical properties of a polymer layer formed by applying energy to the reactive compound such as the polymerizable polymer, such as coefficient of thermal expansion, glass transition temperature, Young's modulus, Poisson's ratio, rupture stress, yield stress, and pyrolysis temperature.

Particularly, because the rupture stress, yield stress and pyrolysis temperature of the conductive substance-adsorbing resin layer to be formed are preferably higher, these additives are useful. The formed conductive substance-adsorbing resin layer can be measured for its heat endurance in a temperature cycle test, a test of heating over time, or a reflow rest. With respect to pyrolysis temperature for example, the resin layer can be judged to have sufficient heat endurance when the reduction in weight thereof upon exposure to an atmosphere at 200° C. for 1 hour is 20% or less. To realize such thermal physical properties, the additives described above are appropriately used.

The conductive substance-adsorbing resin precursor layer 3 forms chemical bonding to the active sites generated upon application of energy, thereby adhering to the adhesion assist layer 2 or the resin film layer 1, to form a conductive substance-adsorbing resin layer 4. In this case, metal ions or metal fine particles may, before energy application, have previously been adsorbed to the metal-adsorbing functional group of the compound contained in the conductive substance-adsorbing resin precursor layer or may be adsorbed to the metal-adsorbing functional group of the compound that has been adhered to the adhesion assist layer 2 or the resin film layer 1 through chemical bonding formed by energy application.

The thickness of the conductive substance-adsorbing resin precursor layer is preferably about 0.05 to 5 μm, more preferably 0.1 to 3 μm, even more preferably 0.2 to 2 μm. By forming the conductive substance-adsorbing resin precursor layer having thickness in this range, the conductive substance-adsorbing resin layer formed from this precursor layer by energy application in a later step can attain sufficient adhesion strength, and the strength of the formed film can also be maintained in a preferable range.

The conductive substance-adsorbing resin precursor layer 3, similarly to the adhesion assist layer 2, can be formed by a method such as coating, transfer, or printing. When the conductive substance-adsorbing resin precursor layer is arranged by coating, the adhesion assist layer 2 and the conductive substance-adsorbing resin precursor layer 3 may be applied either simultaneously or successively in this order. When the layers are formed by transfer, a transfer film having the two layers, that is, the conductive substance-adsorbing resin precursor layer 3 and the adhesion assist layer 2 may be prepared on a temporary support and transferred at one time by lamination method. The coating method may be a general method described above in forming the adhesion assist layer 2.

The solvent that can be used in applying the conductive substance-adsorbing resin precursor layer 3 is not particularly limited as long as it can dissolve the compounds used, and examples of the solvent include water and organic solvents to which a surfactant may be added.

Preferable examples of the solvent include water, alcohol solvents such as methanol, ethanol, 1-methoxy-2-propanol and isopropyl alcohol, acids such as acetic acid, ketone solvents such as acetone, methyl ethyl ketone and cyclohexanone, ether solvents such as tetrahydrofuran, ethylene glycol monomethyl ether, ethylene glycol monobutyl ether and ethylene glycol monoethyl ether, and nitrile solvents such as acetonitrile and propionitrile. Further examples of the solvent that can be used herein include amide solvents such as formamide, N-methyl-2-pyrrolidone, N,N-dimethylacetamide and N,N-dimethylformamide, ethylene glycol monomethyl ether, tetrahydrofuran, ester solvents such as ethyl acetate, butyl acetate, isopropyl acetate and methyl acetate, acetates such as cellosolve acetate, propylene glycol monomethyl ether acetate and carbitol acetate, cellosolves such as cellosolve and butyl cellosolve, carbitols such as carbitol and butyl carbitol, aromatic hydrocarbons such as toluene, xylene, benzene, naphthalene, hexane and cyclohexane, as well as dimethylformamide, dimethylacetamide and N-methylpyrrolidone.

When the reactive compound used in the precursor layer is a hydrophobic compound, the solvent is preferably an amide solvent, a ketone solvent or a nitrile solvent. Specifically, dimethylacetamide, methyl ethyl ketone, cyclohexanone, acetonitrile or propionitrile is preferably used.

When the polymer composition is applied, a solvent having a boiling point of 50 to 150° C. is preferable from the viewpoint of easy handleability.

The solvents may be used alone or as a mixture thereof, but a solvent in which the resin film or the adhesion assist layer 2 is hardly dissolved, or a combination of solvents in which active species contained in these layers are hardly eluted, is preferably used in order to allow the surface of the resin film or the adhesion assist layer 2 to be kept smooth.

As a guide for selecting the solvent used in coating the adhesion assist layer 2 with a coating liquid for the conductive substance-adsorbing resin precursor layer 3 containing the polymerizable polymer etc., a solvent causing 5 to 25% solvent absorption rate of the adhesion assist layer can be selected. The solvent absorption rate as used herein can be determined by dipping, in a solvent, a substrate having the adhesion assist layer formed thereon, raising the substrate after 1000 minutes, and measuring a change in the weight of the substrate.

As another guide, a solvent causing 10 to 45% swelling rate of the adhesion assist layer may be selected. The swelling rate can be determined by dipping, in a solvent, a substrate having the adhesion assist layer formed thereon, raising the substrate after 1000 minutes, and measuring a change in the thickness of the substrate.

From the viewpoint of more accurate regulation of film thickness, the viscosity of the coating liquid is regulated preferably in the range of 1 to 2000 cps, more preferably 3 to 1000 cps, more preferably 5 to 700 cps. In the case of formation by printing, not only usual gravure printing but also an inkjet method can be used in printing. When a method such as a printing method or inkjet method is used in printing on the electrically insulating film or the adhesion assist layer 2, the conductive substance-adsorbing resin precursor layer may not be printed on regions not intended to have a conductor in a later step.

In the invention, the conductive substance-adsorbing resin precursor layer 3 can be adhered, by some interactions, to the active sites generated in the resin film layer 1 or the adhesion assist layer 2. Examples of such interactions may include intermolecular interaction, ionic bonding, chemical bonding, and formation of a compatible structure, among which chemical bonding is preferably used from the viewpoint of higher adhesion strength.

As methods of generating active sites in the resin film or the adhesion assist layer 2, irradiation with energy rays such as light, electromagnetic waves, electron beams, and radiant rays or application of heat energy or pressure energy is conceivable. Specific examples include UV ray irradiation, IR ray irradiation, plasma irradiation, X-ray irradiation, alpha ray irradiation, and gamma ray irradiation. Among them, energy ray irradiation and heat energy are preferable as a method of generating active sites, and irradiation such as UV ray irradiation is more preferable because energy can be given with a simple device. Even if a special active species-forming compound is not mixed in the resin film or the adhesion assist layer 2, active sites can be generated by giving high energy by irradiation with shortwave UV rays or electron beams or by plasma irradiation.

In energy irradiation, energy such as light may be applied to the side of the conductive substance-adsorbing resin precursor layer or to the other side (that is, the substrate side), or when heat energy is used, the whole of the layers may be heated. However, when a colored resin film made of polyimide or the like is used, light energy is given toward the upper part of the conductive substance-adsorbing resin precursor layer. When a transfer sheet including the conductive substance-adsorbing resin precursor layer and the adhesion assist layer 2 layered therein is transferred onto the resin film to form these layers thereon, energy may be given before transfer or after transfer. When light energy is applied before transfer, the energy may be applied either to the side of the protective film or to the side of the support. As the amount of energy applied, an amount of energy for generating active sites and for forming chemical bonding by interaction with the conductive substance-adsorbing resin precursor layer can be appropriately applied. In this manner, the conductive substance-adsorbing resin precursor layer can be adhered to the adhesion assist layer 2 or the resin film. In such an example, for example, the radical generator for generating active sites is mixed in the adhesion assist layer 2, while the reactive compound having both a radically polymerizable unsaturated double bond and a functional group capable of interacting with a conductive material is contained in the conductive substance-adsorbing resin precursor layer, so that upon energy application, radicals are generated as the active sites on the surface of the adhesion assist layer 2, while the reactive compound contained in the conductive substance-adsorbing resin precursor layer produces chemical bonding as a graft.

When energy is applied by irradiation with radiant rays such as light or heat, heating with a heater or with IR rays is used. Examples of its light source include a mercury lamp, a metal halide lamp, a xenon lamp, a chemical lamp, a carbon arc lamp, and LED. Examples of radiant rays include electron beams, X-rays, ion beams and far infrared rays. In addition, g-rays, i-rays, deep-UV rays and high-density energy beams (laser beams) can also be used.

Energy shall not be given to portions (for example, via holes) intended to be free of a conductive layer thereon. For example, bonding for adhesion between the conductive substance-adsorbing resin precursor layer 3 and the adhesion assist layer 2 or the resin film can arbitrarily not be formed by masking during light irradiation. To the contrary, the conductive substance-adsorbing resin layer can be formed on the whole surface by applying energy to the whole surface.

When a polymerizable polymer having an average molecular weight of 20,000 or more and a polymerization degree of 2,000-mer or more is used as the reactive compound to form the conductive substance-adsorbing resin layer, its polymerization proceeds easily by exposure to low-energy light, thus further preventing decomposition of the formed polymer.

A step (development step) of removing unreacted compounds not contributing to adhesion, contained in the conductive substance-adsorbing resin precursor layer, and conductive substance-adsorbing resin reactants that could not form bonding to the adhesion assist layer 2 or the resin film 1, can be carried out after the conductive substance-adsorbing resin precursor layer is adhered to the adhesion assist layer 2 or the resin film 1 by applying energy. This step is carried out generally with a solvent that dissolves the conductive substance-adsorbing resin precursor but does not dissolve the resin film and the adhesion assist layer 2. Specifically, water, an alkali developing solution or an organic solvent-based developing solution is used. As the development method, a method of stirring in the solvent or a method of washing with a shower under pressure is often used.

The conductive substance-adsorbing resin precursor layer is formed and then adhered to the adhesion assist layer 2 or the resin film by irradiation with the energy, then an excess of the conductive substance-adsorbing resin precursor is removed by the method described above, and the conductive substance-adsorbing resin precursor layer may further subjected to plasma treatment and UV ray treatment in order to increase the adhesion thereof to metal ions and metal fine particles.

When a metal layer-coated resin film prepared by using the conductive substance-adsorbing resin film of the invention is used in forming wirings, a step of making a hole can be carried out in order to connect a metal layer formed if necessary on the surface of the conductive substance-adsorbing resin film to a wiring on the back side of the resin film.

Generally, the hole is formed by drilling. In fine processing, a method of forming a via hole by laser processing or the like can be used. The laser used in the hole making step may be a laser with any oscillation wavelengths ranging from the UV region to IR region. The UV region refers to a wavelength region in the range of 50 to 400 nm, and the IR region to a wavelength region in the range of 750 nm to 1 mm. The lasers that can be used herein include a UV laser, a carbon dioxide gas laser, etc.

The UV laser usually has an emission wavelength region of 180 to 380 nm, preferably 200 to 380 nm, more preferably 300 to 380 nm. Examples of the laser for producing UV laser beams include gas lasers such as Ar, $N_2$, ArF, KrF, XeCl, XeF, He—Cd and He—Ne lasers, solid lasers such as YAG, NdYAG, Nd glass and alexandrite lasers, and dye lasers using a dye dissolved in an organic solvent. Particularly, the YAG laser and NdYAG laser which are capable of high output energy oscillation, are long lasting and are capable of inexpensive maintenance are preferable. As the oscillation wavelength in the UV region, the higher harmonic wave of these lasers is preferably used. The laser higher harmonic wave is obtained for example by oscillating a 1.06 μm laser light (fundamental wave) with a YAG laser or the like and then passing the laser light through two nonlinear crystals (LBO crystals) arranged in parallel with a predetermined space therebetween in the direction of a light path, thereby converting the laser light via an SHG light with a wavelength of 0.53 μm into a THG light with a wavelength of 0.355 μm (UV light). Examples of the apparatus producing such higher harmonic waves include laser beam machines disclosed in JP-A No. 11-342485 etc. The laser light can be emitted continuously or intermittently, and is preferably emitted intermittently with single pulse in order to prevent cracking.

Irradiation frequency (number of shots) in single-pulse irradiation is usually 5 to 500 times, preferably 10 to 100 times. As the irradiation frequency increases, processing time increases and cracking is liable to occur. The pulse period is usually 3 to 8 kHz, preferably 4 to 5 kHz. The carbon dioxide gas laser is a molecular laser, converts electric power into a laser light at an efficiency of 10% or more, and can generate significant power as high as several dozen kW with an oscillation wavelength of 10.6 μm. Usually, a hole is formed with a laser light having an energy of about 20 to 40 mJ with a short pulse of about $10^{-4}$ to $10^{-8}$ sec. The number of shots necessary for making a via hole is usually about 5 to 1,000. The holes thus formed are used as a through-hole and a blind via hole.

The ratio (hole diameter ratio:$d1/d0 \times 100(\%)$) of the inner diameter (d1) of the bottom portion of a hole to the inner diameter (d0) of the inlet (surface) portion of the hole is usually 40% or more, preferably 50% or more, more preferably 65% or more. The d0 is preferably in the range of 10 to 250 μm, more preferably in the range of 20 to 80 μm. A hole having a large hole diameter ratio is less liable to occur conduction deficiency between insulating layers and is highly reliable.

The hole making step in the invention may be carried out in the state of the resin film, or after formation of the adhesion assist layer 2 thereon, or after formation of the conductive substance-adsorbing resin precursor layer thereon, or after formation of the conductive substance-adsorbing resin film by adsorbing metal fine particles or metal ions described later, or after formation of a metal conductive layer. When the step of making a hole in the resin film is carried out, the adhesion assist layer 2 and the conductive substance-adsorbing resin precursor layer 3 are formed in the hole portion by transfer or coating in a later step, whereby a conductive substance can also be adhered to the hole portion and a highly adherent conductor layer can also be formed in the hole portion. On the other hand, when the hole making step is carried out after formation of the adhesion assist layer 2, after formation of the conductive substance-adsorbing resin precursor layer 3, after formation of a seed layer described later, or after formation of a metal conductor layer, the resulting hole can be subjected to plating as it is, but is preferably subjected to plating in combination with conditioning treatment or catalyst addition treatment that is conducted usually for plating, in order to secure more excellent adhesion.

A desmear process of removing smear remaining in the hole portion may be carried out in a step after the hole making step. This process involves roughening the surface of the via hole portion by a dry process and/or a wet process as necessary. The dry roughening process may include mechanical polishing such as buffing and sandblasting, as well as plasma etching, etc. The wet roughening process may include chemical treatment with oxidizers such as permanganates, bichromates, ozone, hydrogen peroxide/sulfuric acid, or nitric acid, strong bases, or resin-swelling solvents. The desmear process can also be conducted after the insulating film is subjected to electroless plating with a seed to form a metal film serving as a feed layer. This process may include a swelling step, an etching step, a neutralization step. This process typically involves a step of swelling with an organic solvent-based swelling liquid at 60° C. for 5 minutes, a step of etching with a sodium permanganate-based etching solution at 80° C. for 10 minutes, and a step of neutralization with a sulfuric acid-based neutralization liquid at 40° C. for 5 minutes. When a resin film such as a polyimide film is used, a step of washing with a strong alkali solution is sometimes conducted.

When the desmear process is not carried out, washing with a solvent dissolving or swelling the resin film is also effective.

In the invention, metal ions, metal fine particles or conductive fine particles may be adsorbed as necessary to the conductive substance-adsorbing resin precursor layer before forming the conductive substance-adsorbing resin or to the conductive substance-adsorbing resin layer formed from the resin precursor layer.

Metal ions, metal fine particles or conductive fine particles, when adsorbed to the conductive substance-adsorbing resin layer in the invention, may be adsorbed to it in the state of the conductive substance-adsorbing resin precursor layer or to the conductive substance-adsorbing resin layer which is formed by applying energy to the conductive substance-adsorbing resin precursor layer and thereby adhered to the adhesion assist layer 2 or the resin film.

The method of adsorbing metal ions or the like to the conductive substance-adsorbing resin precursor layer may be a method wherein metal ions are dissolved in a salt form in a coating liquid for forming the conductive substance-adsorbing resin precursor, or metal fine particles, metal salts or conductive fine particles are dispersed in a coating liquid for forming the conductive substance-adsorbing resin precursor, followed by application onto the adhesion assist layer 2 or the resin film, or a method wherein the conductive substance-adsorbing resin precursor layer is formed on the resin film or on the adhesion assist layer and then dipped together with the resin film in a metal ion solution or in a dispersion liquid of metal fine particles, metal salts or conductive fine particles, thereby being impregnated with the metal ions, metal fine particles, metal salts or conductive fine particles, to adsorb them.

In the case of adsorption to the conductive substance-adsorbing resin layer formed from the resin precursor layer, the resin film having the conductive substance-adsorbing resin layer formed thereon may be dipped in a metal ion solution or in a dispersion liquid of metal fine particles, metal salts or conductive fine particles, thereby being impregnated with the metal ions, metal fine particles, metal salts or conductive fine particles, to adsorb them. In another method, ions may be directly implanted into, and adsorbed to, the film by ion implantation or the like.

For adsorbing the objective metal ions, metal fine particles or conductive fine particles to the conductive substance-adsorbing resin layer, metal ions once adsorbed to, or metal ions allowed to previously occur on, the conductive substance-adsorbing resin layer may be subjected to ion-exchange with the intended other metal ions, or the metal ions may be reduced and thereby precipitated as metal fine particles. The surface of metal fine particles may be subjected to electroless plating or displacement plating to form complex metal fine particles having another metal precipitated thereon. Moreover, a method wherein metal colloids, metal nanoparticles or conductive fine particles are aggregated and precipitated by interaction may also be used.

The metal salts, metal fine particles or conductive fine particles may be dissolved or dispersed in a suitable solvent, followed by applying the resulting solution or dispersion liquid containing dissociated metal ions or particles onto the conductive substance-adsorbing resin precursor layer.

The step of adsorbing metal ions, metal fine particles or conductive fine particles to the conductive substance-adsorbing resin layer in the invention, when conducted in adsorbing them to the conductive substance-adsorbing resin layer after adhesion to the adhesion assist layer 2 or the resin film, may be carried out simultaneously with a step (development step) in which an unreacted conductive substance-adsorbing resin precursor not contributing to adhesion, and conductive substance-adsorbing resin reactants that could not form bonding to the adhesion assist layer 2 or the resin film, are removed. When the two steps are simultaneously conducted, the unreacted conductive substance-adsorbing resin precursor not contributing to adhesion, and the conductive substance-adsorbing resin reactants that could not form bonding to the adhesion assist layer 2 or the resin film, are removed. This can be carried out by previously dispersing or dissolving the materials intended to be adsorbed, such as conductive fine particles, metal fine particles, metal ions or metal salts, in a solvent, specifically in water, an alkali developing solution or an organic solvent-based developing solution.

By contacting with the solution containing metal ions or with the solution having metal fine particles or conductive fine particles dispersed therein, the functional groups can adsorb the metal ions. From the viewpoint of sufficient adsorption, the metal ion or metal salt concentration of the solution contacted is preferably in the range of 0.01 to 50% by weight, more preferably in the range of 0.1 to 30% by weight.

The contact time is preferably about 10 seconds to 24 hours, more preferably about 1 minute to 180 minutes.

In the invention, the adsorbed metal ions may be reduced to form metal fine particles in the adsorbed form. In this step, a reducing agent used in reducing metal salts or metal ions adsorbed to, or impregnated in, the conductive substance-adsorbing resin precursor layer, thereby making a metal (fine particle) film, is not particularly limited as long as it has physical properties of reducing the used metal salt compound to precipitate its metal. Examples of such reducing agents include hypophosphite, tetrahydroborate and hydrazine.

The reducing agent can be selected appropriately in relationship to the metal salts or metal ions used. For example, when an aqueous solution of silver nitrate is used as the aqueous solution of a metal salt supplying a metal ion or a metal salt, sodium tetrahydroborate is a preferable reducing agent, or when an aqueous solution of palladium dichloride is used, hydrazine is a preferable reducing agent. The method of adding the reducing agent may be, for example, a method wherein metal ions or metal salts are applied onto the surface of the resin film layer on which the conductive substance-adsorbing resin precursor layer is present, and then an excess of the metal salts or metal ions are washed away with water, an organic solvent or a mixture thereof, the resin film having the surface is dipped in water such as deionized water, and a reducing agent is added thereto, or a method wherein an aqueous solution containing a reducing agent at a predetermined concentration is applied or dropped directly onto the surface of the resin film. The amount of the reducing agent added is equal to or more than the equivalent of the metal ion, more preferably at least 10 times the equivalent of the metal ion.

This reducing step is conducted after metal salts or metal ions are adsorbed to the conductive substance-adsorbing resin precursor and may be conducted simultaneously with an electroless plating step described later.

The metal ions, metal fine particles and conductive fine particles that can be used in this step are not particularly limited as long as they interact with the adsorbing functional groups, and known metal ions, metal fine particles and conductive fine particles can be arbitrarily selected and used. Preferable examples include metal fine particles such as Au, Ag, Pt, Cu, Rh, Pd, Al and Cr, oxide semiconductor fine particles such as $In_2O_3$, $SnO_2$, ZnO, CdO, $TiO_2$, $CdIn_2O_4$, $Cd_2SnO_2$, $Zn_2SnO_4$ and $In_2O_3$—ZnO, and fine particles using a material doped with impurities compatible therewith, fine particles of spinel-type compounds such as MgInO and CaGaO, conductive nitride fine particles such as TiN, ZrN and HfN, conductive boride fine particles such as LaB, and organic materials such as conductive polymer fine particles and metal salt-containing polymer fine particles.

When metal fine particles or conductive fine particles are used, their particle diameter is preferably in the range of 0.1 to 1000 nm, more preferably in the range of 1 to 100 nm. When the particle diameter is less than 0.1 nm, the surfaces of fine particles are contacted continuously with one another to form aggregates so that the resulting adsorption property tends to decrease. When the particle diameter is more than 1000 nm, the contact area interacting with, and binding to, the functional groups having adsorption ability is decreased, and thus the adhesion between the hydrophilic surface and particles tends to decrease and the strength of the conductive region tends to deteriorate.

In this step, the metal salt is not particularly limited as long as it is dissolved and dissociable into a metal ion and a base (an anion) in a suitable solvent for adding to the region on which the conductive substance-adsorbing resin layer has been formed. Examples of the metal salt include $M(NO_3)_n$, $MCl_n$, $M_{2/n}(SO_4)$, $M_{3/n}(PO_4)$ wherein M represents a n-valent metal atom. The metal ion is preferably an ion into which the above metal salt is dissociated. Specific examples of the metal ion include Ag ion, Cu ion, Al ion, Ni ion, Co ion, Fe ion, Pd ion, and chrome ion, and preferably Ag or Cu is used as a conductive film and Co as a magnetic film.

After metal ions, metal fine particles or conductive fine particles are adsorbed to the conductive substance-adsorbing resin layer in the invention, a step in which excessive metal ions, metal fine particles or conductive fine particles that could not be adsorbed to the resin layer are washed away, may be carried out as necessary in the invention.

The conductive substance-adsorbing resin film of the invention thus formed is utilizable in various fields requiring the adsorption or capture of metal or the formation of a metal layer excellent in adhesion and is usable not only in preparing a metal layer-coated resin film for flexible printed-wiring board but also as an ion exchange membrane, a metal capturing membrane for capturing a specific metal, and a catalyst-supported membrane for using a metal as catalyst.

The metal precipitated in the conductive substance-adsorbing resin layer by adsorption of the metal ions, metal fine particles or conductive fine particles can be formed as a fractal microstructure and can thereby further improve the adhesion between the fine particle layer and the conductive substance-adsorbing resin layer.

With respect to the amount of the metal in the conductive substance-adsorbing resin layer, when the proportion of the metal in a region of from the outermost surface of the conductive substance-adsorbing resin layer to a depth of 0.5 µm, as determined by photographing a cross section of the substrate under a metallographic microscope, is 5 to 50 area-%, and the arithmetic mean roughness Ra (JIS B0633-2001) at the interface between the metal and the conductive substance-adsorbing resin layer is 0.05 to 0.5 µm, stronger adhesion is brought about.

Hereinafter, the application of the conductive substance-adsorbing resin film of the invention to manufacture of a metal layer-coated resin film for flexible printed-wiring board in a preferable application field thereof will be described.

(Manufacture of a Metal Layer-Coated Resin Film)

From the viewpoint of forming a metal layer (conductive layer) excellent in conductivity, it is preferable that when a metal layer-coated resin film for flexible printed-wiring board is manufactured, a metal is adsorbed to the conductive substance-adsorbing resin film, and the metal is subjected as a base to plating.

When the conductive substance-adsorbing resin film is subjected to plating, the film when having no metal, metal ions or conductive fine particles adsorbed thereto may be allowed to adsorb, to its conductive substance-adsorbing resin layer, a material serving as an electroless plating catalyst selected from a metal, metal ions and conductive fine particles, and then subjected to electroless plating.

Alternatively, the conductive substance-adsorbing resin film having a conductive substance-adsorbing layer to which a metal, metal ions or conductive fine particles serving as an electroless plating catalyst has previously been adsorbed may be directly used.

The conductive substance-adsorbing resin film, when having metal ions, metal fine particles or conductive fine particles previously adsorbed in a predetermined amount or more and thereby having a sufficiently conductive layer formed thereon, may be subjected to electroplating by passing an electric current directly through the conductive layer.

In the step of forming a metal layer, the electroless plating catalyst adsorbed to the conductive substance-adsorbing layer is mainly a O-valent metal such as Pd, Ag, Cu, Ni, Al, Fe or Co. In the invention, Pd or Ag is particularly preferable from the viewpoint of easy handleability and high catalytic performance. The method of immobilizing the O-valent metal on the interacting region is for example a method wherein a metal colloid having a charge regulated so as to interact with interacting groups on the interacting region is applied to the interacting region. Generally, the metal colloid can be prepared by reducing metal ions in a solution containing a charged surfactant or a charged protectant. The charge of the metal colloid can be regulated with the surfactant or protectant used herein, and the metal colloid having a charge thus regulated is allowed to interact with the interacting groups possessed by the conductive substance-adsorbing resin precursor layer, thereby adhering a metal colloid (electroless plating catalyst) to the conductive substance-adsorbing resin precursor layer.

The electroless plating catalyst precursor used in this step can be used without particular limitation as long as it can become an electroless plating catalyst by a chemical reaction. Metal ions of the O-valent metal used in the electroless plating catalyst described above are mainly used. The catalyst precursor is not particularly limited as long as it is dissociable into a metal ion and a base (an anion). Examples include $M(NO_3)$—, $MCl_n$, $M_{2/n}(SO_4)$, $M_{3/n}(PO_4)$ wherein M represents a n-valent metal atom. The metal ion is preferably an ion into which the above metal salt is dissociated. Specific examples of the metal ion include Ag ion, Cu ion, Al ion, Ni ion, Co ion, Fe ion, and Pd ion, among which Ag ion and Pd ion are preferable from the viewpoint of catalytic performance.

The metal ion that is an electroless plating catalyst precursor is converted by reduction reaction into a O-valent metal that is an electroless plating catalyst. The metal ion that is an electroless catalyst precursor may be adhered to the substrate and then converted by separate reduction reaction into a O-valent metal to be used as an electroless catalyst, before dipping in an electroless plating bath. Alternatively, the substrate with the electroless plating catalyst precursor may be dipped in an electroless plating bath, thereby converting the catalyst precursor into a metal (electroless plating catalyst) by a reducing agent in the electroless plating bath.

For adhering a plating catalyst to the conductive substance-adsorbing resin precursor layer fixed on the resin film in an example of the invention, the substrate is dipped in a plating catalyst solution (for example, an aqueous solution of silver nitrate or a tin-palladium colloid solution). Examples of the electroless plating catalyst include metal fine powders such as those of palladium, gold, platinum, silver, copper, nickel, cobalt and tin and/or their halides, oxides, hydroxides, sulfides, peroxides, amine salts, sulfates, nitrates, organic acid salts, and organic chelate compounds. These materials adsorbed to various inorganic components may also be used. The inorganic components in this case include not only the compounds described above, such as colloidal silica, calcium carbonate, magnesium carbonate, magnesium oxide, barium sulfate, barium titanate, silicon oxide, amorphous silica, talc, clay and mica, but also any fine powders of alumina, carbon etc. The size of the fine powder is preferably 0.1 to 50 µm in terms of average particle diameter.

The conductive fine particles, metal ions, metal salts, electroless plating catalysts, electroless plating catalyst precursors described above may be used alone or in combination thereof as necessary. To attain desired conductivity, plural materials may be previously mixed for use.

The substrate is dipped in the plating catalyst solution and then washed to remove an excess of the plating catalyst solution.

When the seed layer applied to the adhesion assist layer exhibits sufficient electrical conductivity, it may be subjected directly to electroplating to form a conductor layer thereon, but there is the case where sufficient electrical conductivity may not be attained by merely applying the metal ions or the electroless plating catalyst, and in this case, electroless plating is further conducted by using the electroless plating catalyst.

The electroless plating refers to an operation wherein a solution in which metal ions intended to be precipitated as plating film have been dissolved is used to precipitate a metal by chemical reaction. The electroless plating may be conducted after soft etching and acid washing. The electroless plating may also be conducted after a step of treatment with a general activator or accelerator that is commercially available.

In the electroless plating in this step, for example, the substrate having the electroless plating catalyst applied thereto, obtained in the above step of applying the electroless plating catalyst etc., is washed with water to remove an excess of the electroless plating catalyst (metal) and then dipped in an electroless plating bath, thereby effecting plating. The electroless plating bath used may be a generally known electroless plating bath.

When the substrate having the electroless plating catalyst precursor applied thereto, which has the electroless plating catalyst precursor adhered to or impregnated in the conductive substance-adsorbing resin precursor layer, is to be dipped in an electroless plating bath, the substrate is washed with water to remove an excess of the precursor (metal salt or the like) and then dipped in the electroless plating bath. In this case, reduction of the precursor and subsequent electroless plating is carried out in the electroless plating bath. The electroless plating bath used herein, similar to the one described above, may also be a generally known electroless plating bath. Alternatively, the electroless plating catalyst precursor may be converted by reduction into an electroless plating catalyst which is then dipped in the electroless plating bath, and in this case too, an excess of the electroless plating catalyst precursor or the like is removed by washing etc.

The general electroless plating bath has a composition mainly containing (1) metal ions for plating, (2) a reducing agent, and (3) an additive (stabilizer) for improving the stability of metal ions. This plating bath may, besides these components, contain known additives such as a stabilizer of the plating bath.

Metals known to be usable in an electroless plating bath include silver, chrome, copper, tin, lead, nickel, gold, palladium and rhodium, among which silver, copper, gold, chrome and nickel are particularly preferable from the viewpoint of electrical conductivity.

There are the optimal reducing agent and additives compatible with each of these metals, and such optimal materials are simultaneously used in a preferable embodiment. For example, a copper electroless plating bath contains $Cu(SO_4)_2$ as the copper salt, HCOH as the reducing agent, and additives such as EDTA that is a stabilizer of copper ions and a chelating agent such as Rochelle salt. A plating bath used in electroless plating of CoNiP contains cobalt sulfate and nickel sulfate as its metal salts, sodium hypophosphite as the reducing agent, and complexing agents such as sodium malonate, sodium malate, and sodium succinate. A palladium electroless plating bath contains $(Pd(NH_3)_4)Cl_2$ as the metal ion, $NH_3$ and $N_2NNH_2$ as the reducing agent, and EDTA as the stabilizer.

These plating baths may contain components other than the optimal reducing agents and additives, depending on the intended object.

The thickness of the conductive film (metal layer) thus formed can be regulated depending on the metal salt or metal ion concentration of the plating bath, the time of dipping in the plating bath, or the temperature of the plating bath. From the viewpoint of electrical conductivity, the film thickness is preferably 0.1 μm or more, more preferably 3 μm or more. The time of dipping in the plating bath is preferably about 1 minute to 3 hours, more preferably about 1 minute to 1 hour.

When a copper-coated plate used in the semi-additive process is to be prepared, its metal film may be 3 μm or less in thickness to make it conductive without defects.

For improving adhesion to the resin forming the electrically insulating layer, a first metal formed in electroless plating and a second metal formed in electroplating may be the same or different; for example, electroless plating may be conducted with chrome or nickel and electroplating for forming a conductor layer may be conducted by copper plating.

When a copper-coated plate used in the subtractive process is to be prepared, the electroless plating step may be followed by the electroplating step intended to improve the thickness of the metal layer (conductive layer) or film properties.

After electroless plating in the electroless plating step, electroplating in the electroplating step is conducted by using, as an electrode, the metal film (conductive film) formed in the electroless plating step. Using as a base the metal film excellent in adhesion to the resin support, a new metal film having arbitrary thickness can be easily formed thereon. By adding the electroplating step, the metal film having thickness in accordance with the object can be formed, and the conductive material obtained in this embodiment can be preferably used in various applications.

As the method of electroplating in this embodiment, a method known in the art can be used. The metals used in electroplating in this step include copper, chrome, lead, nickel, gold, silver, tin and zinc, among which copper, gold and silver are preferable from the viewpoint of electrical conductivity, and copper is more preferable. The thickness of the metal film obtained by electroplating varies depending on the intended use and can be controlled by regulating the concentration of the metal in the plating bath, the dipping time, or current density. The thickness of the film when used in general electric wirings is preferably 0.3 μm or more, more preferably 3 μm or more, from the viewpoint of electrical conductivity. As described above, the electroplating step in the invention can also be carried out not only in forming a patterned metal film having thickness in accordance with the object, but also in electroplating for the purpose of mounting on IC etc. The plating conducted for this purpose can be carried out by using a material selected from the group consisting of nickel, palladium, gold, silver, tin, solder, rhodium, platinum and compounds thereof, on the conductive film formed from copper or the like or on a metal-patterned surface.

In this manner, the metal layer-coated resin film can be obtained.

When the metal layer-coated resin film thus obtained is used in preparing a multilayer wiring board such as CCL, a step of forming a via hole for connecting the formed metal layer (conductive layer=wiring) to a wiring on the back side of the resin film, and a step of forming a conductive material in the hole portion, thereby securing the connection of the metal layer to the wiring on the back side, may be carried out. When (1) a via hole is first made in the resin film layer 1 itself and then the adhesion assist layer 2 and the conductive substance-adsorbing resin precursor layer 3 are formed on the surface of the resin film layer 1 provided with the hole, the electroless plating step can be carried out thereby achieving plating in the inside of the hole simultaneously with plating on the surface of the conductive substance-adsorbing layer to easily form a wiring for connection between the multiple layers.

On the other hand, when the adhesion assist layer 2, the conductive substance-adsorbing resin precursor layer 3 and the metal layer are formed in this order on the surface of the resin film layer 1 and then a via hole is formed, only the hole portion can be subjected separately to electroless plating in the same method as in plating in a through-hole with an existing copper-coated plate, thereby forming connection.

In either case, electroless plating and subsequent electroplating can be combined thereby filling the inside of the via hole with the plating metal to form a connecting wiring.

As another connection-forming method, it is also possible to employ a method of forming connecting wirings by injecting conductive fine particles, metal nanoparticles, a metal nano-paste, a conductive adhesive etc., containing metal elements such as copper, silver and gold, into the hole portion by a printing method, a dispenser method or an ink jet method.

After formation of the metal layer or after further formation of wirings connection between multiple layers, heat treatment etc. may be conducted. The heating temperature in the heat treatment is preferably 100° C. or more, more preferably 130° C. or more, even more preferably about 180° C. Depending on the resin, the heat treatment is conducted sometimes at its glass transition temperature. In consideration of treatment efficiency and the dimensional stability of the electrically insulating layer, the heating temperature is preferably 400° C. or less. The heating time is preferably 10 minutes or more, more preferably 30 to 120 minutes. When thermosetting resins are used in the resin film, the adhesion assist layer 2 and/or the conductive substance-adsorbing layer 4, the heating treatment proceeds curing of their resins, thereby further improving the adhesion thereof to a metal layer (peel strength).

In the metal layer-coated resin film of the invention, a metal layer can be formed on the whole surface of a necessary region on the surface of the resin film, and the metal layer can be patterned by a known method to form wirings.

For example, the surface of the metal layer of the metal layer-coated resin film is provided with a plating resist with which a wiring pattern can be formed by the subtractive method or the semi-additive method.

The subtractive method refers to a method of forming a metal pattern, wherein the metal film formed by electroplating in the method described above is subjected to (1) coating with a resist layer→(2) pattern exposure and development to form a resist pattern of the conductor to be left→(3) etching to remove an unnecessary metal film→(4) removing of the resist layer to form a metal pattern. The thickness of the metal film used in this embodiment is preferably 5 μm or more, more preferably in the range of 5 to 50 μm.

The semi-additive method refers to a method of forming a metal pattern, wherein the metal film formed on the conductive substance-adsorbing resin precursor layer is subjected to (1) coating with a resist layer→(2) pattern exposure and development to form a resist pattern of the conductor to be removed→(3) plating to form a metal film on a non-pattern region of the resist→(4) removing of DFR→(5) etching to remove an unnecessary metal film. The metal film first formed is used as a feed layer to form a conductive layer on a resist-free region by electroplating. As the plating method, the electroless plating or electroplating described above can be used. The thickness of the metal film to be coated with the resist layer is preferably about 0.3 to 3 μm in order to achieve etching in a short time. The formed metal pattern may further be subjected to electrolytic plating or electroless plating.

Hereinafter, the method of forming a wiring pattern will be described in detail.

(1) Resist layer forming step

"With Respect to Resist"

The photosensitive resist used may be a photocurable-type negative resist or a photodissolution-type positive resist to be dissolved by exposure. As the photosensitive resist, it is possible to employ (1) photosensitive dry film resist (DFR), (2) liquid resist, and (3) ED (electrodeposited) resist. Each of these resists has characteristics, and the photosensitive dry film resist (DFR) (1) can be used in a dry process and is thus easily handled, the liquid resist (2) can form a thin film as a resist to produce a pattern of good resolution, and ED (electrodeposited) resist (3) can form a thin film as a resist to produce a pattern of good resolution and is excellent in adhesion by conforming well to an uneven coated surface. The resist used may be selected appropriately in consideration of these characteristics.

"Coating Method"

1. Photosensitive Dry Film

The photosensitive dry film generally has a sandwich structure sandwiched between a polyester film and a polyethylene film and is pressure-bonded by means of a heat roll while the polyethylene film is peeled with a laminator.

With respect to the photosensitive dry film resist, its formulation, film-making method and lamination method are described in detail in paragraph numbers [0192] to [0372] in Japanese Patent Application No. 2005-103677 previously proposed by the present applicant, and such description can also be applied to the invention.

2. Liquid Resist

Examples of the coating method include spray coating, roll coating, curtain coating and dip coating. For simultaneously coating both sides, roll coating or dip coating is preferable in that both-side coating is feasible.

The liquid resist is described in detail in paragraph numbers [0199] to [0219] in Japanese Patent Application No. 2005-188722 proposed previously by the present applicant and such description can also be applied to the invention.

3. ED (Electrodeposited) Resist

The ED resist is colloid in which a photosensitive resist is formed into fine particles and suspended in water. The particles are charged so that when a voltage is applied to a conductor layer, the resist is precipitated on the conductor layer by electrophoresis, and colloidal particles are bound to one another to form a film on the conductor layer.

(2) Pattern Exposure Step

"Exposure"

A substrate having a resist film arranged on a metal film is adhered to a mask film or a photographic dry plate and exposed to light in the photosensitive range of the resist used. When the film is used, it is adhered with a printing frame under vacuum and exposed to light. The exposure source can be a point light source when a pattern width is about 100 μm. When a pattern with a pattern width of 100 μm or less is formed, a parallel light source is preferably used. In recent years, a pattern is formed sometimes by digital exposure with a laser without using a mask film or a photographic dry plate.

"Development"

Any solvent may be used as long as it dissolves a light-unexposed portion in the case of a photocurable negative resist or a light-exposed portion in the case of a photodissolution type positive resist to be dissolved by exposure, but mainly an organic solvent or an alkaline aqueous solution is used, and in recent years, an alkali aqueous solution is used for reduction in environmental burden.

(3) Formation of a metal film in a non-pattern region of the resist by plating

After formation of the pattern, electroplating can further be conducted by using, as a feed electrode, a metal film or a conductive film (for example a film formed by electroless plating) below the pattern. Using as a base the metal film excellent in adhesion to the electrically insulating resin film, a new metal film having arbitrary thickness can be easily formed thereon. By adding this step, the metal film having thickness in accordance with the object can be formed, and the conductive material obtained in this embodiment can be preferably used in various applications.

As the method of electroplating in this embodiment, a method known in the art can be used. The metals used in electroplating in this step include copper, chrome, lead, nickel, gold, silver, tin and zinc, among which copper, gold and silver are preferable from the viewpoint of electrical conductivity, and copper is more preferable.

The conductor layer formed by electroplating becomes thicker with a thicker resist or thinner with a thinner resist. It is not preferable that the conductor layer by electroplating is thicker than the resist, because the resist is hardly removed and the space between adjacent lines is filled.

(4) Resist Removing Step
"Removing Step"

After the metal (conductive) pattern is completed by electroplating, a step of removing the unnecessary plating resist is necessary. The resist can be removed by spraying with a removing solution. The removing solution varies depending on the type of resist. Generally, a solvent or solution for swelling the resist is sprayed thereby swelling and removing the resist.

(5) Etching step
"Etching"

Etching is a step in which the unnecessary feed layer is chemically removed by dissolution to express insulating property between conductor patterns to complete the conductor pattern. The etching step is conducted by vertically spraying an etching solution mainly on a horizontal conveyor. The etching solution is an oxidizing aqueous solution that oxides and dissolves a metal layer. Examples of the etching solution used herein include a ferric chloride solution, a cupric chloride solution, and an alkali etchant. Because the resist may be removed with an alkali, a ferric chloride solution or a cupric chloride solution is mainly used.

In the method of the invention, the interface of the substrate is not made uneven and is thus excellent in removability of conductive components in the vicinity of the interface of the substrate, and the conductive substance-adsorbing resin precursor layer that introduces a metal film onto a substrate is bound, at the terminal of a polymer chain, to the adhesion assistant layer 2 or the electrically insulating layer and has a highly movable structure, so that in the etching step, the etching solution can easily diffuse into the graft polymer layer and is excellent in an ability to remove metal components at the interface between the substrate and the metal layer, thus forming a pattern excellent in sharpness.

After a wiring pattern is formed, a step of inactivating the conductive substance-adsorbing resin layer remaining on the non-wiring portion may be conducted in the invention. By inactivation, the metal as plating seed can be easily removed, and troubles such as ion migration can be prevented. The method of inactivation may be a method wherein the conductive substance-adsorbing resin precursor layer is allowed to interact with a certain type of ion compound thereby forming an insoluble salt, or a method wherein the functional groups capable of interacting with a plating catalyst are chemically modified into other insulating groups. For improving adhesion to an electrically insulating layer as an upper layer or to a solder resist layer, the functional groups may be modified into those capable of chemical bonding to these layers.

After a wiring pattern is formed, a step of removing the conductive substance-adsorbing resin precursor layer remaining on the non-wiring portion may be conducted in the invention. As the removal method, for example, a desmear process used in surface roughening treatment may be used. The desmear process using alkaline permanganate is known. The desmear process can also be conducted after the insulating film is subjected to electroless plating with a seed to form a metal film serving as a feed layer. This process includes a swelling step, an etching step, a neutralization step, etc. By this treatment, adhesion to the electrically insulating layer as an upper layer or to a solder resist layer can be increased. When wirings are formed, the surface is not roughened and thus it is possible to form a highly fine wiring pattern.

In the invention, the formed conductor pattern may be subjected to copper surface treatment. Examples of the treatment method that can be used herein include a black oxidation treatment method, a copper oxide reduction method, a copper roughening method, a roughening electroless copper plating method, etc. By carrying out these methods, adhesion to the electrically insulating layer as an upper layer or to a solder resist layer can be increased. For preventing the oxidation of the metal conductor portion, rust prevention treatment is conducted in some cases.

After a wiring pattern is formed, the process is initiated again from the step of forming an electrically insulating layer, whereby a multilayer substrate can be formed. As the outermost layer, a protective film can be formed, and finishing plating (for example, nickel-gold plating, solder coating or the like) for the step of forming a solder resist film can be carried out to produce the substrate.

By preparing a flexible printed substrate by the method of the invention, a printed-wiring board capable of forming a fine wiring pattern having excellent characteristics can be easily formed as described above. Using conductive materials such as a metal layer-coated resin film obtained by the production method of the invention, a fine copper wiring of 20 µm or less having high adhesion strength which is hardly formed by the related art can be formed by known etching treatment.

Hereinafter, the invention will be described with reference to the Examples, but the invention is not limited thereto.

Example 1

Synthesis of Polymer P1 Having Polymerization Initiation Groups 30 g of propylene glycol monomethyl ether (MFG) was introduced into a 300-mL three-neck flask and then heated to 75° C. A solution consisting of 8.1 g of [2-(acryloyloxy)ethyl] (4-benzoylbenzyl)dimethyl ammonium bromide, 9.9 g of 2-hydroxyethyl methacrylate, 3.5 g of isopropyl methacrylate, 0.43 g of dimethyl-2,2'-azobis(2-methylpropionate), and 30 g of MFG was added dropwise over 2.5 hours thereto. Thereafter, the reaction temperature was increased to 80° C., and the mixture was further reacted for 2 hours, to yield polymer P1 having polymerization initiation groups.

Formation of Adhesion Assist Layer 2 Containing an Initiator 20 parts by weight (hereinafter, compounding amounts are expressed in parts by weight) of bisphenol A type epoxy resin (trade name: Epicoat 828, epoxy equivalent 185, manufactured by Yuka-Shell Epoxy Co., Ltd.), 45 parts of cresol novolac type epoxy resin (trade name: Epiclon N-673, epoxy equivalent 215, manufactured by Dainippon Ink and Chemicals, Incorporated.) and 30 parts of phenol novolac resin (trade name: Fenolite, phenolic hydroxy equivalent 105, Dainippon Ink and Chemicals, Incorporated.) were dissolved by heating in 20 parts of ethyl diglycol acetate and 20 parts of solvent naphtha under stirring, and then cooled to room temperature. To the resulting solution were added 30 parts of a cyclohexanone varnish (trade name: YL6747H30, nonvolatile component 30 wt %, weight-average molecular weight 47000, manufactured by Yuka-Shell Epoxy Co., Ltd.) containing Epicoat 828 and a phenoxy resin (bisphenol S), 0.8 part of 2-phenyl-4,5-bis(hydroxymethyl)imidazole, 2 parts of finely pulverized silica and 0.5 part of a silicone-based antifoaming agent. 10 parts of the polymer P1 having polymerization initiation groups was added to the resulting mixture, and methyl ethyl ketone was added thereto such that the total amount of nonvolatile solids became 20% by weight, thereby preparing a coating liquid for forming adhesion assist layer 2.

Capton 150EN (manufactured by Du Pont-Toray Co., Ltd.) was used as a resin film (polyimide film) serving as a support, and the coating liquid for forming adhesion assist layer 2 was applied continuously by die coating onto both sides of the resin film such that the dried solid thickness became 3 μm, followed by drying at 140° C. for 30 minutes, to form an adhesion assist layer 2.

Synthesis of Conductive Substance-Adsorbing Resin Precursor P2

60 g of polyacrylic acid (average molecular weight 25000, Wako Pure Chemical Industries, Ltd.) and 1.38 g (0.0125 mol) of hydroquinone (Wako Pure Chemical Industries, Ltd.) were introduced into a 1-L three-neck flask provided with a condenser tube, then 700 g of N,N-dimethylacetamide (DMAc, Wako Pure Chemical Industries, Ltd.) was introduced into the flask, and the mixture was stirred at room temperature to form a uniform solution. 64.6 g of 2-methacryloyloxyethyl isocyanate (Karenz MOI, Showa Denko K.K.) was added dropwise to the solution under stirring. Subsequently, 0.79 g of di-n-butyltin dilaurate (Tokyo Chemical Industry Co., Ltd.) suspended in 30 g of DMAc was added dropwise thereto. The reaction mixture was stirred under heating on a water bath at 65° C. After 5 hours, heating was stopped, and the reaction mixture was cooled naturally to room temperature.

300 g of the reaction solution was placed in a beaker and cooled to 5° C. on an ice bath. 41.2 mL of 4 N aqueous sodium hydroxide was added stepwise over 1 hour to the reaction solution under stirring. During dropwise addition, the temperature of the reaction solution was 5 to 11° C. After dropwise addition, the reaction solution was stirred at room temperature for 10 minutes, followed by removing solids by filtration under suction, thereby giving a brown solution. This solution was subjected to re-precipitation with 3 L ethyl acetate to precipitate solids which were then collected by filtration. The solids were re-slurried overnight in 3 L acetone. The solids were separated by filtration, and separately dissolved in a mixed solvent of 2 g water and 1 g acetonitrile per 1 g of the polymer, and this solution was passed through an ion-exchange resin column thereby completely removing ions, and the filtrate was vacuum-dried for 10 hours to give pale-brown powder P2. When 1 g of this polymer was dissolved in a mixed solvent of 3 g water and 3 g acetonitrile, the solution had a pH value of 5.53 and a viscosity of 4.54 cps (this viscosity was determined at 28° C. with RE80 viscometer with rotor 30XR14, manufactured by Toki Sangyo Co., Ltd.). The molecular weight determined by GPC was 30,000.

As the liquid for forming a conductive substance-adsorbing resin precursor layer, an adsorbing resin precursor layer-forming liquid having the following composition was prepared and applied by die coating onto both sides of the adhesion assist layer 2 to provide a coating having a thickness of 1.5 μm on each side of the adhesion assist layer 2, and then dried at 80 to 120° C. to form a conductive substance-adsorbing resin precursor layer.

| (Adsorbing resin precursor layer-forming liquid composition 2) | |
|---|---:|
| Conductive substance-adsorbing resin precursor P2 | 3.1 g |
| Water | 24.6 g |
| 1-Methoxy-2-propanol | 12.3 g |

After the adsorbing resin precursor layer was formed on the adhesion assist layer 2, the side of the adsorbing resin precursor layer was exposed to UV ray having a wavelength of 254 nm as energy for generating active sites for adhering by using an exposure device (trade name: UVX-02516S1LP01, UV irradiation device manufactured by Ushio, Inc.) for 1 minute at room temperature. After exposure of the whole surface, unnecessary conductive substance-adsorbing resin precursor reactants that could not interact with the adhesion assist layer 2 were sufficiently washed away with deionized water, thereby giving the conductive substance-adsorbing resin film in Example 1 having the conductive substance-adsorbing layer 4 arranged on the surface of the resin film layer 1 substrate.

Example 2

A conductive substance-adsorbing resin film in Example 2 was formed in the same manner as in Example 1 except that for the polyimide film that is a resin film in Example 1, a film having a hole of 200 μm in diameter formed by drilling was used as a resin support 1.

Example 3

A conductive substance-adsorbing resin film in Example 3 was formed in the same manner as in Example 2 except that the adsorbing resin precursor layer-forming liquid composition 2 used in forming the conductive substance-adsorbing precursor layer in Example 2 was changed to composition 3 below.

The adsorbing resin precursor layer-forming liquid composition 3 contains silver nitrate, and thus the conductive substance-adsorbing layer formed from the composition 3 has previously adsorbed the conductive substance.

| (Adsorbing resin precursor layer-forming liquid composition 3) | |
| --- | --- |
| Conductive substance-adsorbing resin precursor P2 | 3.1 g |
| Water | 24.6 g |
| 1-Methoxy-2-propanol | 12.3 g |
| Silver nitrate | 0.04 g |

Adsorption of the Conductive Substance and Measurement of the Adsorption Amount

—Adsorption Treatment of the Conductive Substance—

The conductive substance-adsorbing film prepared in each of Examples 1 and 2 was dipped in 0.1 wt % aqueous silver nitrate (manufactured by Wako Pure Chemical Industries, Ltd.) for 15 minutes and then washed with distilled water, thereby adsorbing silver to the conductive substance-adsorbing layer.

—Measurement of the Amount of the Conductive Substance Adsorbed—

When the conductive substance-adsorbing resin film in Examples 1 and 2, to which silver had been adsorbed by the treatment described above, and the conductive substance-adsorbing resin film to which the conductive substance silver had been previously adsorbed in Example 3, were measured for the amount of adsorbed silver in the following method, it was confirmed that the amount of adsorbed silver was 170 mg/m$^2$ in Example 1, 160 mg/m$^2$ in Example 2, and 180 mg/m$^2$ in Example 3, and it was thus confirmed that a sufficient amount of silver (conductive substance) had been adsorbed in any cases.

Method of measuring the amount of adsorbed silver: Standard samples having a predetermined amount of silver adsorbed thereto were prepared and used to prepare a calibration curve showing strengths in fluorescent X-ray against the amounts of silver. Then, the samples in the Examples were subjected to fluorescent X-ray measurement.

Comparative Example 1

The same procedure as in Example 1 was conducted except that the conductive substance-adsorbing resin precursor layer 3 was not formed on the adhesion assist layer 2, and the adhesion assist layer 2 only was formed on the surface of the resin film layer 1, then subjected to energy application by light exposure and sufficiently washed with deionized water, whereby a resin film laminate in Comparative Example 1 was obtained.

In the same manner as in Example 1, the resin film laminate was dipped in 0.1 wt % aqueous silver nitrate (manufactured by Wako Pure Chemical Industries, Ltd.) for 15 minutes and then washed with distilled water, thereby adsorbing silver, and the amount of silver adsorbed was measured. The result indicated that the amount was 1 mg/m$^2$ or less, and it was thus confirmed that sufficient metal adsorption was not achieved. It is estimated that the conductive substance-adsorbing resin layer was not formed, and thus metal adsorbing sites scarcely occurred on the surface.

Comparative Example 2

A resin film laminate in Comparative Example 2 was obtained in the same manner as in Example 1 except that the conductive substance-adsorbing resin precursor layer 3 was formed on the adhesion assist layer 2, and then the side of the conductive substance-adsorbing resin precursor layer was not irradiated with UV ray having a wavelength of 254 nm as energy for generating active sites for adhering.

In the same manner as in Example 1, the resin film laminate was dipped in 0.1 wt % aqueous silver nitrate (manufactured by Wako Pure Chemical Industries, Ltd.) for 15 minutes and then washed with distilled water, thereby adsorbing silver, and the amount of silver adsorbed was measured. The result indicated that the amount was 1 mg/m$^2$ or less, and sufficient metal adsorption was not confirmed.

The results are shown in Table 1.

TABLE 1

| | Amount of silver adsorbed | Adsorbability of conductive substance |
| --- | --- | --- |
| Example 1 | 170 mg/m$^2$ | A |
| Example 2 | 160 mg/m$^2$ | A |
| Example 3 | 180 mg/m$^2$ | A |
| Comparative Example 1 | 1 mg/m$^2$ or less | B |
| Comparative Example 2 | 1 mg/m$^2$ or less | B |

As is evident from Table 1, it can be seen that the conductive substance-adsorbing resin films of the invention, although being resin layer laminates, have a high ability to adsorb the conductive substance and can adsorb and fix a sufficient amount of the conductive substance. With respect to the adsorbability of conductive substance in Table 1, A was given when the amount of silver adsorbed is 10 mg/m$^2$ or more, and B was given when the amount of silver adsorbed is less than 10 mg/m$^2$.

Hereinafter, the method for producing a metal layer-coated resin film by using the conductive substance-adsorbing resin film of the invention will be described with reference to the Examples.

Example 4

The conductive substance-adsorbing resin film prepared in Example 1 was dipped in 0.1 wt % aqueous silver nitrate (manufactured by Wako Pure Chemical Industries, Ltd.) for 10 minutes and then washed with distilled water. Thereafter, the film was dipped in an electroless plating bath with the following composition for 10 minutes to form an electroless copper plating layer. The thickness of the electroless plating layer was 1.5 µm in any cases.

| <Components of the electroless plating bath> | |
| --- | --- |
| Copper sulfate | 0.35 g |
| NaK tartrate | 1.75 g |
| Sodium hydroxide | 0.75 g |
| Formaldehyde | 0.25 g |
| Water | 47.8 g |

Further, the resin film was subjected, with the electroless copper plating layer as a feed layer, to electroplating for 30 minutes under the condition of 3 A/dm$^2$ in a copper electroplating bath with the following composition. The thickness of copper formed after electroplating treatment was 18 µm.

| <Composition of the electroplating bath> | |
|---|---|
| Copper sulfate | 38 g |
| Sulfuric acid | 95 g |
| Hydrochloric acid | 1 mL |
| Cupper Gream PCM (manufactured by Mertex) | 3 mL |
| Water | 500 g |

The resulting substrate having a conductor layer formed thereon was heat-treated at 140° C. for 1 hour.

Evaluation of the Performance of the Metal Layer-Coated Resin Films

The performance of the resulting metal layer-coated resin films in Examples 4 and 5 was evaluated by the following method.

A dry etching resist film was laminated on the surface, at the metal layer side, of the metal layer-coated resin film such that the thickness of the resist film became 20 μm, and then the resin film having the resist film formed on the surface of the metal layer was adhered to a mask film or a dry plate, and exposed to light in the photosensitive region of the resist, to form a pattern such that portions intended to form wirings were covered with the resist, and an alkali developing solution wad used to dissolve and remove the resist on the light-unexposed regions until the conductor layer was exposed.

A portion that was covered with the resist such that a "solid portion" with 5 mm (width)×10 cm in the conductor layer could be formed was specially arranged such that the adhesion strength between the metal layer and the resin film could be measured when a wiring pattern was formed. On the other portion, a pattern of conductor line/space of 10 μm/10 μm was formed for test.

Then, wet etching (an etching solution based on ferric chloride or an etching solution based on cupric chloride) was carried out, and the copper in the non-wiring pattern from which the resist had been removed by development was removed by etching until the lower resin layer was exposed. Thereafter, the unnecessary etching resist was removed. The unnecessary etching resist was removed by spraying with a removing solution.

The portion of the metal layer of copper with 5 mm×10 cm in the resulting substrate having the wiring pattern formed thereon was examined in a 90° peel test with a Tensilon tensile tester (AGS-J manufactured by Shimadzu Corporation). The peel strength is shown in Table 2.

The pattern of the resulting line/space pattern of 10 μm/10 μm was observed under an electron microscope. A was given when the line/space pattern of 10 μm/10 μm was formed without wiring cutting or line thickening and evaluated to be excellent in thin-line reproducibility; B was given when the line was partially uneven; and C was given when the wiring had a problem such as wiring cutting or conjunction of adjacent lines.

Comparative Example 3

In place of the metal layer-coated resin film prepared by using the conductive substance-adsorbing resin film obtained in Example 4, a metal layer-coated resin film was prepared by forming a metal feed layer by sputtering on the surface of the resin film, and then subjecting it to electroplating in the same manner as described above.

The feed layer was formed in the following manner. That is, the resin film was heat-treated at 200° C. for 1 minute in a chamber kept at a vacuum of 0.01 to 0.1 Pa, and then a nickel-chrome alloy target containing 20 wt % chrome was used as the sputtering target, to form a nickel-chrome alloy layer of 20 nm in thickness on the surface of polyimide (resin film), and a copper layer of 100 nm in thickness was further formed thereon and used as a feed layer. Electroplating was conducted in the same manner as in Examples 4 and 5 with the formed feed layer as an electrode, thereby giving the metal layer-coated resin film in Comparative Example 3, and this metal layer-coated resin film was then used and evaluated in the same manner as in Example 4.

Comparative Example 4

A thermoplastic polyimide precursor varnish layer was formed to have a thickness of 2.5 μm on each of both sides of a commercial polyimide film (resin film), and then a rolled cupper foil (thickness 18 μm) was placed thereon and put between cushioning materials and pressure-bonded under heating for 4 hours under the condition of 300° C. and 25 kg/cm² with a heating pressing machine. Using this metal layer-coated resin film, the same operation as in Example 4 was conducted.

The evaluation results of the metal layer-coated resin films in Examples 4 and 5 and Comparative Examples 3 and 4 are shown in Table 2.

TABLE 2

| | Thin-line reproducibility | Adhesion strength |
|---|---|---|
| Example 4 | A | 0.8 kN/m |
| Comparative Example 3 | A | 0.6 kN/m |
| Comparative Example 4 | C (A junction between lines was observed) | 1.2 kN/m |

As is evident from Table 2, it was found that the metal layer-coated resin film prepared by using the conductive substance-adsorbing resin film of the invention is excellent in adhesion between the metal layer and the support, and when wirings are prepared by using this metal layer-coated resin film, fine wirings with high adhesion strength and excellent in thin-line reproducibility can be formed. On the other hand, the metal layer-coated resin film in Comparative Example 3 using a metal film formed by a known sputtering method is inferior in adhesion between the metal layer and the resin film, and the metal layer-coated resin film in Comparative Example 4 having a metal layer heat-bonded with a varnish is excellent in adhesion, but is inferior in thin-line reproducibility and can thus seen to be not suitable for preparation of fine wirings. From these results, it can be seen that the metal layer-coated resin film of the invention is useful for preparation of fine wirings such as in a flexible printed substrate or the like.

Example 5

In place of the conductive substance-adsorbing resin precursor P2 in Example 1, a conductive substance-adsorbing resin precursor P3 was synthesized as described below. (Synthesis Example: Synthesis of conductive substance-adsorbing resin precursor P3)

34.5 g of N,N-dimethylacetamide was placed in a 1000-mL three-neck flask and heated to 75° C. in a nitrogen stream. A solution of 6.65 g of 2-hydroxyethyl acrylate, 28.5 g of 2-cyanoethyl acrylate, and 0.65 g of V-601 (manufactured by Wako Pure Chemical Industries, Ltd.) in 35 g of N,N-dimethylacetamide was added dropwise thereto over 2.5 hours. After dropwise addition, the mixture was heated to 80° C. and further stirred for 3 hours. Thereafter, the reaction solution was cooled to room temperature.

To the reaction solution were added 0.29 g of di-tert-butylhydroquinone, 0.29 g of dibutyltin dilaurate, 18.56 g of Karenz AOI (manufactured by Showa Denko K.K.) and 19 g of N,N-dimethylacetamide, and the mixture was reacted at 55° C. for 4 hours. Thereafter, 3.6 g of methanol was added to the reaction mixture and then reacted for additional 1.5 hours. After the reaction was finished, the reaction solution was subjected to re-precipitation with ethyl acetate:hexane (1:1) to precipitate solids which were then recovered to give 32 g polymer A having polymerizable groups and interacting groups.

The conductive substance-adsorbing resin precursor P3 was used to prepare an adsorbing resin precursor layer-forming solution having the following composition as a solution for forming a conductive substance-adsorbing resin precursor layer, followed by applying it by die coating onto both sides of the adhesion assist layer 1 such that the resulting coating becomes 1.5 μm in thickness after drying, and thereafter, the coating was dried at 80 to 120° C., whereby a conductive substance-adsorbing resin precursor layer was formed.

| (Adsorbing resin precursor layer-forming liquid composition 3) | |
| --- | --- |
| Conductive substance-adsorbing resin precursor (P3) | 10.5 parts by weight |
| Acetone | 73.5 parts by weight |
| Methanol | 33.5 parts by weight |
| N,N-Dimethylacetamide | 5.0 parts by weight |

After the conductive substance-adsorbing resin precursor layer was formed on the adhesion assist layer 2, only the portions of the precursor layer on which a metal layer was to be arranged were irradiated with UV ray by an UV exposure device (model number: UVF-502S, lamp: UXM-501MD, manufactured by SAN-EI ELECTRIC CO., LTD.) with an irradiation power of 1.5 mW/cm$^2$ (the irradiation power was measured with UV ray integrating actinometer UIT150 light-receiving sensor UVD-S254, manufactured by Ushio Inc.) for 600 seconds, and thereafter, the substrate on which graft polymers had been generated was dipped in acetone under stirring for 10 minutes and then washed with distilled water. The resin film having the conductive substance-adsorbing resin layer formed on the adhesion assist layer 1 was prepared in this manner.

[Adsorption Treatment of a Conductive Substance]

The resin film was dipped for 30 minutes in an acetone solution containing 1 wt % Pd and then washed by dipping in acetone. Subsequently, the substrate A2 having the polymer layer was dipped for 15 minutes in a mixed solution of 1% dimethyl borane-water/methanol (water/methanol=1/3) and then washed by dipping in acetone. In this manner, a resin film F having the conductive substance adsorbed thereto was prepared.

The amount of palladium adsorbed was measured by coupled induced plasma mass spectrometry. The amount of palladium adsorbed was 220 mg/m$^2$.

Then, a metal wiring-forming metal layer-coated resin film characterized in that a metal film portion on which a wiring pattern can be formed and a metal-free resin portion on which a metal wiring pattern cannot be formed are simultaneously present was prepared by conducting an electroless plating step and an electroplating step in the same manner as in Example 4 except that in place of the conducive substance-adsorbing resin film prepared in Example 1, the resin film F having the conductive substance adsorbed thereto was used, and the operation in Example 4 in which the resin film was dipped in 0.1 wt % aqueous silver nitrate for 10 minutes and then washed with distilled water was not conducted. When the performance of the metal layer-coated resin film was evaluated by forming a pattern in a similar manner, the thin-line formability was excellent and the adhesion strength was 0.7 kN/m.

From the above results, a flexible printed substrate is prepared by using the metal wiring-forming metal layer-coated resin film prepared by the method of the invention, whereby a printed-wiring board excellent in productivity can be easily formed.

INDUSTRIAL APPLICABILITY

The conductive substance-adsorbing resin film of the present invention and the method for producing the same can be used not only in preparing a metal layer-coated resin film for a flexible printed-wiring board, but also in an ion-exchange membrane, a metal-capturing membrane for capturing a specific metal, a catalyst-supported membrane for using a metal as catalyst, an antistatic film, and an electromagnetic shielding film.

The metal layer-coated resin film prepared by using the conductive substance-adsorbing resin film is useful particularly as a flexible printed-wiring board, can form a fine wiring pattern and is useful in forming a flexible printed-wiring board showing high adhesion strength.

DESCRIPTION OF SYMBOLS

1: Resin film (resin support)
2: Adhesion assist layer
3: Conductive substance-adsorbing resin precursor layer
4: Conductive substance-adsorbing resin layer
5: Metal layer The disclosure of Japanese Patent Application Nos. 2007-095759 and 2007-146249 is incorporated herein by reference in its entirety.

The invention claimed is:

1. A conductive substance-adsorbing resin film comprising at least two resin layers, wherein
   at least one of the resin layers is an adsorbing resin layer having a property of adsorbing a conductive substance or a metal; and
   the adsorbing resin layer is formed by applying energy to an adsorbing resin precursor layer containing an oligomer with a molecular weight of 1,000 to 300,000 having a cyano group as a functional group having a property of adsorbing a conductive substance or a metal, and thereby generating chemical, electrical or physical bonding between the adsorbing resin precursor layer and another adjacent resin layer and adhering the layers to each other.

2. The conductive substance-adsorbing resin film of claim 1, wherein the adsorbing resin layer having a property of adsorbing a conductive substance or a metal is arranged on one side or both sides of a resin layer constituting a support, and the adsorbing resin layer and the resin layer constituting a support are adhered directly to each other by generating chemical, electrical or physical bonding.

3. The conductive substance-adsorbing resin film of claim 1, wherein the adsorbing resin layer having a property of adsorbing a conductive substance or a metal is arranged on one side or both sides of a resin layer constituting a support, and the resin film is provided with at least one adhesion assist layer which is present between the adsorbing resin layer and the resin layer constituting a support and which generates chemical, electrical or physical bonding to the adsorbing resin layer and the resin layer constituting a support and thereby adheres to the layers.

4. The conductive substance-adsorbing resin film of claim 1, wherein
the adsorbing resin layer having a property of adsorbing a conductive substance or a metal includes a compound having a functional group having a property of adsorbing a conductive substance or a metal, selected from a functional group having a positive charge or dissociable to have a positive charge, a functional group having a negative charge or dissociable to have a negative charge, a nonionic polar group capable of interaction with a metal, a functional group capable of having a chelation or multidentate coordination structure with a conductive substance or a metal, a functional group capable of inclusion, or a functional group interacting with a solvent as water of crystallization in which a metal is held, and
the adsorbing resin layer has a property of adsorbing at least one selected from metal ions, metal fine particles or conductive fine particles by salt formation, multidentate coordination, metal salt dispersion, inclusion, ion implantation, or ion exchange with a metal ion or a metal fine particle.

5. The conductive substance-adsorbing resin film of claim 1, wherein the conductive substance-adsorbing resin film is ultimately provided with a hole penetrating from one side to the other side.

6. A conductive substance-adsorbing resin film comprising at least two resin layers, wherein
at least one of the resin layers is an adsorbing resin layer having a property of adsorbing a conductive substance or a metal; and
a compound having a functional group having a property of adsorbing a conductive substance or a metal is included in the adsorbing resin layer, and the compound is derived from a copolymer containing units represented by the following formulae (1) and (2):

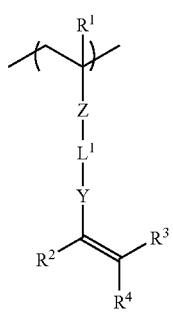

Formula (1)

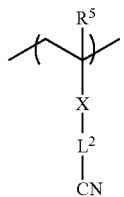

Formula (2)

wherein $R^1$ to $R^5$ each independently represent a hydrogen atom or a substituted or unsubstituted alkyl group; X, Y and Z each independently represent a single bond, a substituted or unsubstituted divalent organic group, an ester group, an amido group or an ether group; and $L^1$ and $L^2$ each independently represent a substituted or unsubstituted divalent organic group.

7. The conductive substance-adsorbing resin film of claim 6, wherein the adsorbing resin layer is formed by applying energy to an adsorbing resin precursor layer containing an oligomer with a molecular weight of 1,000 to 300,000 having a functional group having a property of adsorbing a conductive substance or a metal, and thereby generating chemical, electrical or physical bonding between the adsorbing resin precursor layer and another adjacent resin layer and adhering the layers to each other.

8. The conductive substance-adsorbing resin film of claim 6, wherein the adsorbing resin layer having a property of adsorbing a conductive substance or a metal is arranged on one side or both sides of a resin layer constituting a support, and the adsorbing resin layer and the resin layer constituting a support are adhered directly to each other by generating chemical, electrical or physical bonding.

9. The conductive substance-adsorbing resin film of claim 6, wherein the adsorbing resin layer having a property of adsorbing a conductive substance or a metal is arranged on one side or both sides of a resin layer constituting a support, and the resin film is provided with at least one adhesion assist layer which is present between the adsorbing resin layer and the resin layer constituting a support and which generates chemical, electrical or physical bonding to the adsorbing resin layer and the resin layer constituting a support and thereby adheres to the layers.

10. The conductive substance-adsorbing resin film of claim 6, wherein
the adsorbing resin layer having a property of adsorbing a conductive substance or a metal includes a compound having a functional group having a property of adsorbing a conductive substance or a metal, selected from a functional group having a positive charge or dissociable to have a positive charge, a functional group having a negative charge or dissociable to have a negative charge, a nonionic polar group capable of interaction with a metal, a functional group capable of having a chelation or multidentate coordination structure with a conductive substance or a metal, a functional group capable of inclusion, or a functional group interacting with a solvent as water of crystallization in which a metal is held, and the adsorbing resin layer has a property of adsorbing at least one selected from metal ions, metal fine particles or conductive fine particles by salt formation, multidentate coordination, metal salt dispersion, inclusion, ion implantation, or ion exchange with a metal ion or a metal fine particle.

11. The conductive substance-adsorbing resin film of claim 6, wherein the conductive substance-adsorbing resin film is ultimately provided with a hole penetrating from one side to the other side.

* * * * *